（12）United States Patent
Chainer et al.

(10) Patent No.: US 11,277,944 B2
(45) Date of Patent: Mar. 15, 2022

(54) ENERGY EFFICIENCY BASED CONTROL FOR A COOLING SYSTEM

(71) Applicant: International Business Machines Corporation, Armonk, NY (US)

(72) Inventors: Timothy J. Chainer, Putnam Valley, NY (US); Pritish R. Parida, Fishkill, NY (US); Mark D. Schultz, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/840,402

(22) Filed: Apr. 5, 2020

(65) Prior Publication Data

US 2020/0253092 A1　Aug. 6, 2020

Related U.S. Application Data

(62) Division of application No. 13/738,980, filed on Jan. 10, 2013, now Pat. No. 10,653,044.

(51) Int. Cl.
*H05K 7/20* (2006.01)
(52) U.S. Cl.
CPC ............... *H05K 7/20836* (2013.01)
(58) Field of Classification Search
CPC .. G05D 23/00; G11B 33/144; G11B 33/1413; G11B 33/142; Y02D 10/00; Y02D 10/16
See application file for complete search history.

(56) References Cited

U.S. PATENT DOCUMENTS

| 4,512,161 | A | * | 4/1985 | Logan | ............... G05D 23/1393 236/44 R |
| 5,822,740 | A | | 10/1998 | Haissig et al. | |
| 6,033,302 | A | | 3/2000 | Ahmed et al. | |
| 6,095,426 | A | | 8/2000 | Ahmed et al. | |
| 6,296,193 | B1 | | 10/2001 | West et al. | |
| 6,535,798 | B1 | | 3/2003 | Bhatia et al. | |
| 6,813,897 | B1 | | 11/2004 | Bash et al. | |
| 7,225,113 | B2 | | 5/2007 | Rothschild | |
| 7,272,732 | B2 | | 9/2007 | Farkas et al. | |

(Continued)

FOREIGN PATENT DOCUMENTS

| CN | 102427705 A | 4/2012 |
| JP | 2002373034 A | 12/2002 |
| JP | 02009130358 A | 6/2009 |

OTHER PUBLICATIONS

Anonymous, Method and System for Optimization of Power Consumption in a Data Center through Directed Cooling, Aug. 31, 2010, IP.com No. IPCOM000199360D, 3 Pages.

(Continued)

*Primary Examiner* — Darrin D Dunn
(74) *Attorney, Agent, or Firm* — Daniel Morris; Otterstedt, Wallace & Kammer, LLP

(57) ABSTRACT

A method for controlling a cooling system based on a heat dissipation of an electronic module and an ambient air temperature includes determining a combination of individual controls on components of the cooling system that achieve a specific amount of cooling based on a cooling power relationship for the plurality of components, the heat dissipation of the electronic module and the ambient air temperature, and applying the individual controls to the plurality of components.

9 Claims, 15 Drawing Sheets

(56) References Cited

U.S. PATENT DOCUMENTS

| | | |
|---|---|---|
| 7,591,302 B1 | 9/2009 | Lenehan et al. |
| 7,630,795 B2 | 12/2009 | Campbell et al. |
| 7,688,984 B2 | 3/2010 | DeCallafon |
| 7,966,104 B2 | 6/2011 | Srivastava et al. |
| 8,145,926 B2 | 3/2012 | Park et al. |
| 8,171,314 B2 | 5/2012 | Lovicott et al. |
| 8,208,258 B2 | 6/2012 | Campbell et al. |
| 8,532,826 B2 | 9/2013 | Moss et al. |
| 8,538,598 B2 | 9/2013 | Steinbrecher et al. |
| 8,602,092 B2 | 12/2013 | Lenehan et al. |
| 8,650,420 B2 | 2/2014 | Kato et al. |
| 8,718,835 B2 | 5/2014 | Sankar et al. |
| 8,788,224 B2 | 7/2014 | Dasgupta et al. |
| 8,909,384 B1 | 12/2014 | Beitelmal et al. |
| 9,052,722 B2 | 6/2015 | Chainer et al. |
| 9,163,828 B2 | 10/2015 | Beveridge |
| 9,320,177 B2 | 4/2016 | Levesque |
| 9,348,325 B2 | 5/2016 | Salsbury et al. |
| 2003/0016498 A1 | 1/2003 | Kurokawa et al. |
| 2004/0059518 A1 | 3/2004 | Rothschild |
| 2005/0128700 A1 | 6/2005 | Alperin et al. |
| 2005/0159845 A1 | 7/2005 | Malone et al. |
| 2006/0117205 A1 | 6/2006 | Sawada |
| 2006/0185626 A1 | 8/2006 | Allen et al. |
| 2007/0189740 A1 | 8/2007 | Clements |
| 2007/0297136 A1 | 12/2007 | Konshak |
| 2008/0028778 A1 | 2/2008 | Millet |
| 2008/0165499 A1* | 7/2008 | Campbell ............ H05K 7/2079 361/699 |
| 2008/0266726 A1* | 10/2008 | Murakami ........... H05K 7/2079 361/1 |
| 2008/0310112 A1* | 12/2008 | Long .................... H05K 5/0213 361/701 |
| 2009/0005912 A1 | 1/2009 | Srivastava et al. |
| 2009/0021908 A1 | 1/2009 | Patel et al. |
| 2009/0207567 A1 | 8/2009 | Campbell et al. |
| 2009/0268404 A1 | 10/2009 | Chu et al. |
| 2009/0296342 A1 | 12/2009 | Matteson et al. |
| 2009/0303575 A1 | 12/2009 | Huang et al. |
| 2010/0032142 A1* | 2/2010 | Copeland ........... H05K 7/20836 165/104.33 |
| 2010/0076607 A1 | 3/2010 | Ahmed et al. |
| 2010/0084118 A1 | 4/2010 | Murer et al. |
| 2010/0100254 A1* | 4/2010 | Artman ............... H05K 7/20836 700/299 |
| 2010/0263855 A1 | 10/2010 | Arimilli et al. |
| 2010/0314094 A1* | 12/2010 | Hall ....................... G05D 23/19 165/293 |
| 2011/0060470 A1* | 3/2011 | Campbell .......... H05K 7/20836 700/282 |
| 2011/0063792 A1* | 3/2011 | Schmidt .................... G06F 1/20 361/679.46 |
| 2011/0132579 A1 | 6/2011 | Best et al. |
| 2011/0197612 A1 | 8/2011 | Campbell et al. |
| 2011/0224837 A1 | 9/2011 | Moss et al. |
| 2011/0240281 A1 | 10/2011 | Avery |
| 2012/0000630 A1 | 1/2012 | Reiss et al. |
| 2012/0026691 A1 | 2/2012 | Campbell et al. |
| 2012/0103566 A1 | 5/2012 | Iyengar et al. |
| 2012/0110585 A1 | 5/2012 | Cosentino et al. |
| 2012/0111036 A1 | 5/2012 | Campbell et al. |
| 2012/0158206 A1 | 6/2012 | Longobardi et al. |
| 2012/0201005 A1 | 8/2012 | Barringer et al. |
| 2012/0217316 A1 | 8/2012 | Byquist et al. |
| 2012/0311370 A1 | 12/2012 | Dasgupta et al. |
| 2012/0323400 A1 | 12/2012 | Sankar et al. |
| 2013/0006427 A1* | 1/2013 | Hall .................... G05D 23/1919 700/282 |
| 2013/0098086 A1 | 4/2013 | Sillato et al. |
| 2013/0171536 A1 | 7/2013 | Cerceau et al. |
| 2014/0190681 A1 | 7/2014 | Chainer et al. |
| 2014/0199606 A1 | 7/2014 | Schwab |
| 2014/0236362 A1 | 8/2014 | Drew et al. |
| 2015/0156926 A1 | 6/2015 | Levesque |

OTHER PUBLICATIONS

IBM, Energy efficient cooling system for Data Center, Apr. 23, 2009, IP.com No. IPCOM000182040D, 4 Pages.

Paul J. Otterstedt, List of IBM Patents or Patent Applications Treated as Related, Apr. 6, 2020, pp. 1-2.

* cited by examiner

US 11,277,944 B2

ENERGY EFFICIENCY BASED CONTROL FOR A COOLING SYSTEM

CROSS-REFERENCE TO RELATED APPLICATIONS

This patent application is a divisional of U.S. patent application Ser. No. 13/738,980 filed Jan. 10, 2013, entitled "ENERGY EFFICIENCY BASED CONTROL FOR A COOLING SYSTEM," the complete disclosure of which is expressly incorporated herein by reference in its entirety for all purposes.

STATEMENT REGARDING FEDERALLY SPONSORED RESEARCH OR DEVELOPMENT

This invention was made with Government support under Contract No.: DE-EE0002894 (awarded by Department of Energy (DOE)). The Government has certain rights in this invention.

BACKGROUND

This disclosure relates to the thermodynamic arts, and more particularly, to control methods for cooling systems.

Modern integrated circuit chips, servers and data centers pose significant thermal control challenges. Liquid cooling, air cooling and hybrid liquid-air cooling solutions have been employed.

BRIEF SUMMARY

According to an exemplary embodiment of the present disclosure, a method for controlling a cooling system based on a heat dissipation of an electronic module and an ambient air temperature includes determining a combination of individual controls on components of the cooling system that achieve a specific amount of cooling based on a cooling power relationship for the plurality of components, the heat dissipation of the electronic module and the ambient air temperature, and applying the individual controls to the plurality of components.

According to an exemplary embodiment of the present disclosure, a method for controlling a cooling system includes determining a relationship between a delta temperature and a power usage for each of a plurality of cooling components of the cooling system, determining a low power setting from a combination of the relationships for the plurality of cooling components to maintain a temperature of interest at or below a target temperature, and generating a control signal to the plurality of cooling components according to the low power setting.

According to an exemplary embodiment of the present disclosure, a control system cooling at least one electronic module includes a pump for pumping a coolant, a fan disposed at a heat rejection unit, and a controller controlling the pump and the fan individually based on a cooling power relationship, a heat dissipation of the electronic module and an ambient air temperature, wherein the cooling power relationship is a combination of a first relationship between a delta temperature and a power usage determined for the pump and a second relationship between a delta temperature and a power usage determined for the fan.

BRIEF DESCRIPTION OF THE SEVERAL VIEWS OF THE DRAWINGS

Preferred embodiments of the present disclosure will be described below in more detail, with reference to the accompanying drawings in which.

DETAILED DESCRIPTION

Disclosed is a method for controlling a cooling system having multiple temperature control elements. While embodiments of the present disclosure will be described in the context of a liquid cooled chiller-less data center cooling system, it should be understood that embodiments are not limited thereto. That is, embodiments of the present disclosure can be implemented in connection with a variety of cooling and heating installations.

According to an exemplary embodiment of the present disclosure, a set of cooling energy based feed-forward controls on the cooling system can be implemented to reduce cooling power consumption, while controlling to a specified temperature, including implementations having varying workloads and outdoor environmental conditions. According to an exemplary embodiment of the present disclosure, a set of cooling energy based feed-forward controls on the cooling system can be implemented to operate the cooling system at a lowest energy solution.

According to an exemplary embodiment of the present disclosure, in an cooling system having multiple temperature control elements, e.g., a fan disposed at a heat exchanger, a pump for moving a liquid coolant, and a control valve for controlling a flow path of the liquid coolant, a control method controls the elements to approach (or achieve) a lowest possible cooling energy while controlling to a specified temperature. The specified temperature can be a coolant temperature entering a rack of servers in a data center embodiment, a temperature measured at a component of the rack of servers, etc.

Figure 1:
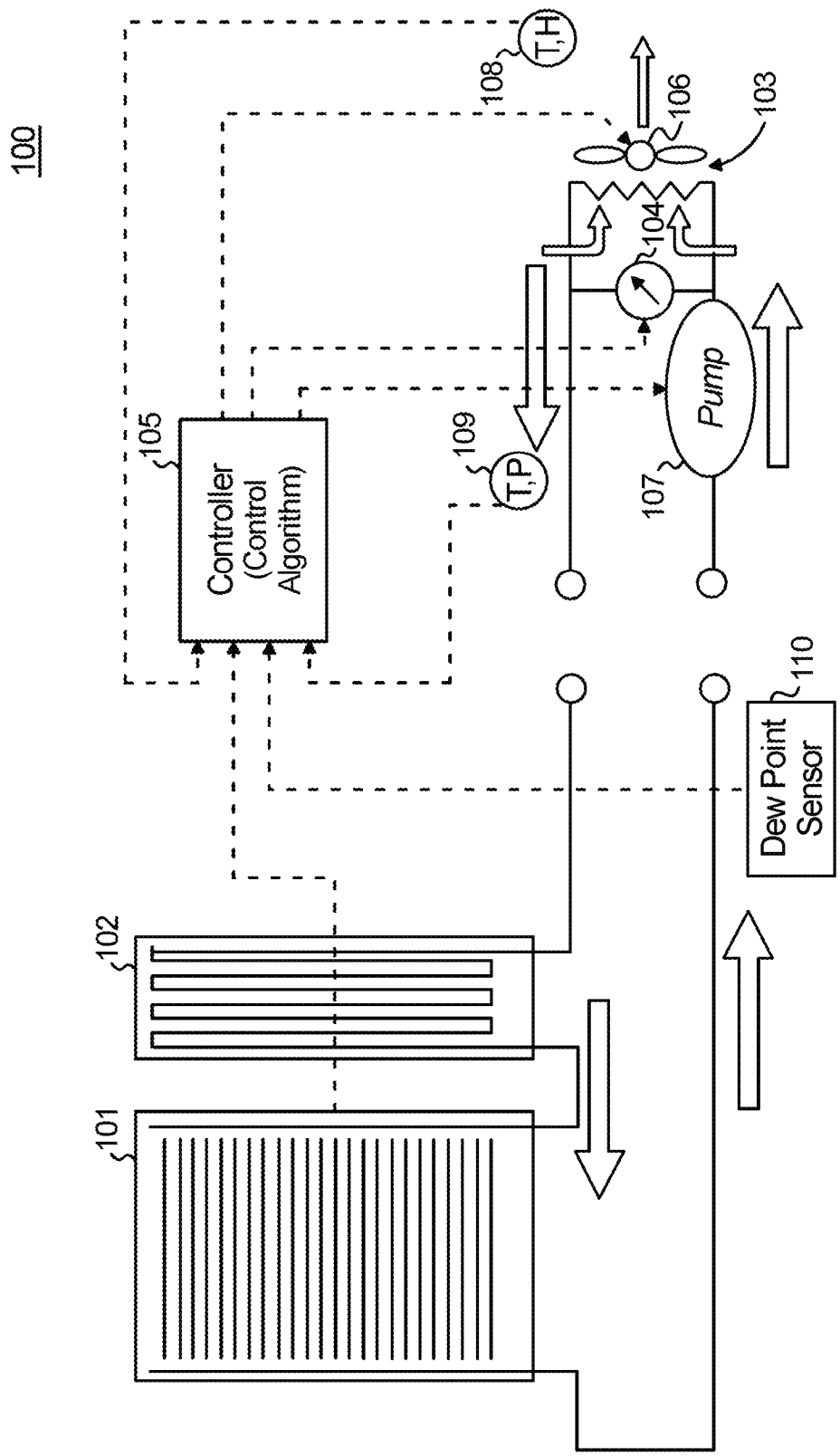
FIG. 1 is a block diagram depicting an exemplary cooling system according to an embodiment of the present disclosure.
Figure 2:
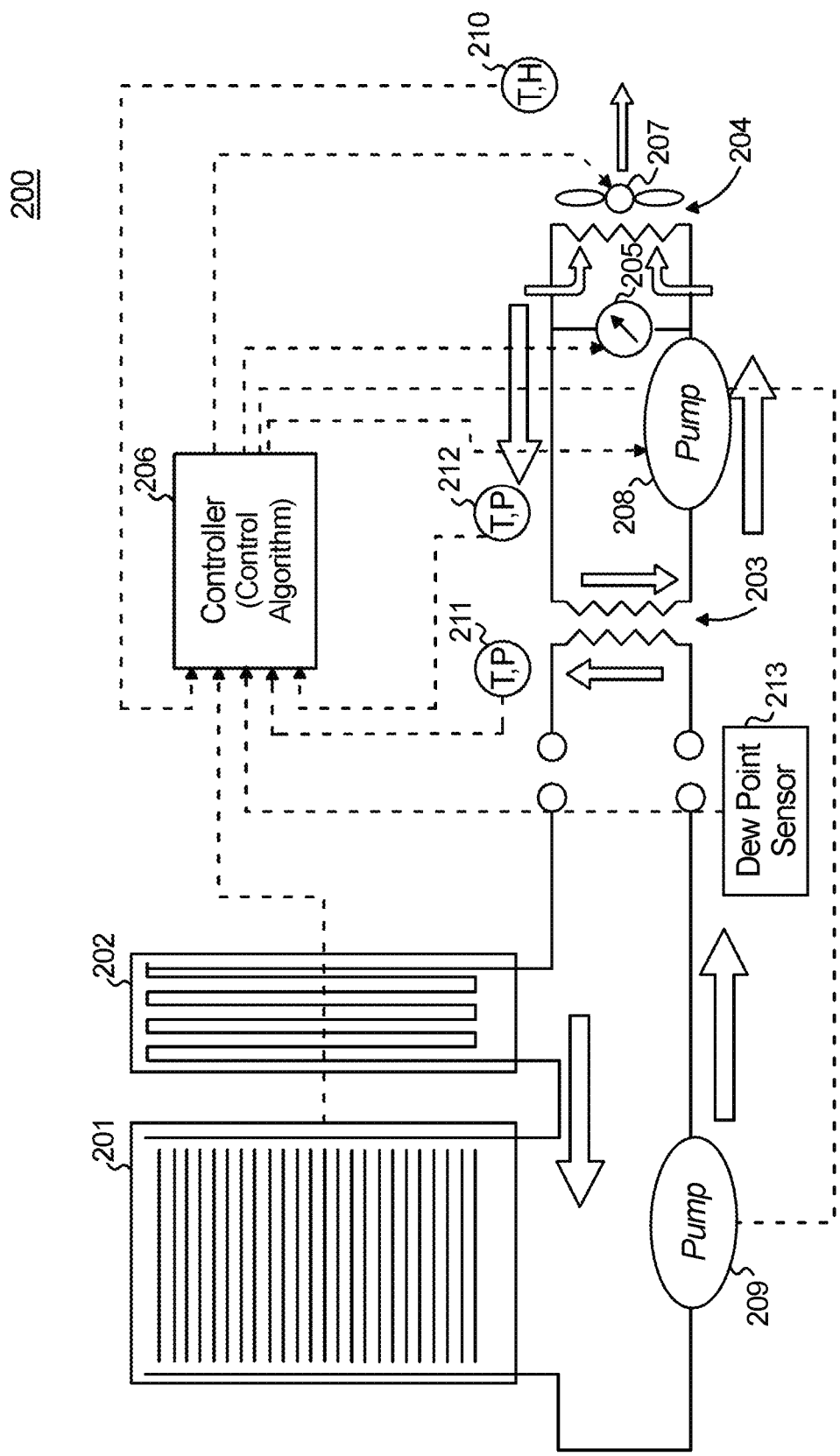
FIG. 2 is a block diagram depicting an exemplary cooling system according to an embodiment of the present disclosure.

Herein, the following terms may be referred to, wherein
1) $T_{controlled}$=temperature being controlled (see 406, FIG. 4)
2) $T_{Max\ Target}$=maximum temperature target (see 403, FIG. 4)
3) $T_{Min\ Target}$=minimum temperature target (see 401, FIG. 4)
4) $T_{Outdoor}$=outdoor air temperature (see 407, FIG. 4)
5) reference heat load=Q0
6) heat load (at any given time)=Q
7) $T_{Controlled}-T_{Outdoor}$ at minimum cooling settings for Q0=(DT)max_Q0
8) $T_{Controlled}-T_{Outdoor}$ at minimum cooling settings for Q=(DT)max_Q=(DT)max_Q0*(Q0/Q)
9) $T_{Controlled}-T_{Outdoor}$ at maximum cooling settings for Q0=(DT)min_Q0
10) $T_{Controlled}-T_{Outdoor}$ at maximum cooling settings for Q=(DT)min_Q=(DT)min_Q0*(Q0/Q)
11) $T_{Spec1}=T_{Max\ Target}-(DT)max\_Q$
12) $DT\_Q=T_{Max\ Target}-T_{Outdoor}$ (for $T_{Outdoor}>T_{Spec1}$, for Q)
13) correction signal . . . , $T_{Corr}$=(DT)max_Q−DT_Q
14) maximum correction signal, $T_{Corr,Max}$=(DT)max_Q−(DT)min_Q
15) scaled correction signal, $S_{Corr}=T_{Corr}*(Q0/Q)$
16) maximum scaled correction signal, $S_{Corr,max}=T_{Corr,Max}*(Q0/Q)$
17) offset signal, $T_{Offset}=T_{Controlled}-T_{Max\ Target}$
18) scaled offset signal, $S_{Offset}=T_{Offset}*(Q0/Q)$
19) error signal, Se=f($S_{Offset}$, time) for example, function for a PID (proportional-integral-derivative) control
20) control signal, Sc=$S_{Corr}$+Se FIG. 1 and FIG. 2 show different exemplary embodiments of a liquid cooled chiller-less data center cooling system.

Referring to FIG. 1, a cooling system 100 includes a rack of servers 101, which is partially/completely liquid cooled, a sidecar 102, and a heat rejection unit 103 (for example, an air-to-liquid heat exchanger, dry cooler, outdoor heat exchanger, etc.). Heat dissipated by electronic components at the rack (also referred to herein as rack equipment) can be transferred to a liquid coolant of the cooling system 100. Both the rack 101 and the sidecar 102 can be configured with liquid cooling components to perform a heat exchange function and move heat away from the electronic components. For example, the rack 101 can include cold plates for heat exchange at the electronic components and the sidecar 102 can include coils for heat exchange in the air of a data center. The heat transferred to a liquid coolant can be dissipated to the ambient by the heat rejection unit 103. It should be understood that the rack 101 and sidecar 102 can include various apparatus for performing heat exchange, including coils, direct contact heat exchangers, plate fin heat exchangers, etc.

The rate of heat transfer at the rack 101 and the sidecar 102 is related to a flow rate of the liquid coolant through them. At the heat rejection unit 103, the heat transfer rate is related to a flow rate of air over a heat exchanger of the heat rejection unit 103 and a liquid coolant flow rate through the heat rejection unit 103. Here, the heat transfer rate can be considered a non-linear monotonically increasing function of air-side flow rate and liquid coolant flow rate.

In FIG. 1, the cooling system 100 can include an electronically controlled by-pass/recirculation valve 104 and a controller 105 implementing a control method. For the single loop configuration of FIG. 1, inputs to the controller 105 can include an ambient temperature and humidity 108, a coolant inlet temperature and a coolant outlet temperature 109, a room dew point temperature (e.g., as determined by a dew point sensor 110), a temperature of electronic components (e.g., processor, memory and hard-drive), a coolant flow rate, an outside air flow rate, an air flow rate (e.g., at the rack and/or sidecar), a server power, etc. The outputs of the controller can include an outdoor fan speed communicated to a fan 106, a pump speed communicated to a pump 107, a recirculation valve control signal (e.g., % open) communicated to the by-pass/recirculation valve 104, etc.

FIG. 2 shows another exemplary cooling system 200. The cooling system 200 is a liquid cooled chiller-less data center cooling system including a rack of servers 201, which is partially/completely liquid cooled, a side-car 202, an inside heat exchanger 203 and a heat rejection unit 204. The heat dissipated by electronic components at the rack can be transferred to the liquid coolant of the cooling system 200 on an inside loop side—partially at the rack 201 and partially at the sidecar 202. This heat can be convected by the inside heat exchanger 203 to a heat rejection side of the cooling system 200, where the heat can be dissipated to the ambient by the heat rejection unit 204.

The rate of heat transfer at the rack 201 and the sidecar 202 is related to the liquid coolant flow rate through them. At the heat rejection unit 204, the heat transfer rate is related to a flow rate of air over a coil of the heat rejection unit 204 and a liquid coolant flow rate through the heat rejection unit 204.

For the dual loop configuration of FIG. 2, inputs to a controller 206 can include the ambient temperature and humidity 210, an inside loop coolant inlet temperature 211 and an inside loop coolant outlet temperature, an outdoor loop coolant temperature 212, a room dew point temperature (e.g., as determined by a dew point sensor 213), a temperature of server components, a coolant flow rate, an outside air flow rate, an air flow rate (e.g., at the rack and/or sidecar), server power, etc. The outputs of the controller 206 can include an outdoor fan speed communicated to a fan 207, an outdoor pump speed communicated to a first pump 208, an inside pump speed communicated to a second pump 209, a recirculation valve control signal communicated to the bypass/recirculation valve 205, etc.

The exemplary cooling systems shown in FIG. 1 and FIG. 2 can be generalized to include N number of fans and 2N number of liquid coolant pumps. In general, the speed of the N number of fans and the 2N number of liquid coolant pumps can be regulated individually or simultaneously to reduce or optimize the data cooling energy and can subsequently reduce a total data center energy consumption while controlling to a specified temperature.

Referring again to FIG. 1 and FIG. 2, the inputs from the rack may include an air temperature entering each server in each rack, an indication of each operational processor's temperature (e.g., actual temperature or an abstract indication of temperature such as the Platform Environment Control Interface (PECI) thermal management technology), each memory's (e.g., DIMM's) temperature, the temperature of each hard-drive, etc. The controller can also monitor the inputs, the outputs, and power consumption by the various components in the data center, and a facility in general.

The heat dissipated by the electronic components of the rack can be transferred to the liquid coolant. In the case of a single loop design, the heat can be convected to the outdoor heat exchanger where it is dissipated to the ambient air. In case of a dual loop, the heat can be transferred from the inner coolant loop to the outer coolant loop via an inside heat exchanger, and convected to the outdoor heat exchanger where it is dissipated to the ambient air. The rate of heat transfer at the rack and the sidecar is related to the flow rate of the liquid coolant through them. At the heat rejection side, the heat transfer rate is related to the air flow rate and the flow rate of the liquid coolant through the heat rejection unit. The heat transfer rate can be considered to be a non-linear monotonically increasing function of air-side flow rate and liquid coolant flow rate.

Referring now to the heat rejection unit 103 or 204; for any given design there is a limit to the air-side flow rate and liquid flow rate. These limits can be used to guide a selection of a heat rejection unit so as to meet the maximum cooling requirements (e.g., worst-case scenario) by some margin. In some exemplary cases, the worst-case scenario refers to a highest ambient air temperature and a highest heat dissipation at the rack, and more generally, a highest heat dissipation in the data center, occurring simultaneously.

According to an exemplary embodiment of the present disclosure, a control method, based on data center heat dissipation and on ambient air temperature, controls a cooling system to reduce cooling power consumption for a specific amount of cooling. According to another exemplary embodiment of the present disclosure, in certain conditions where an outdoor air or ambient temperature is sufficiently high, the temperature of a liquid coolant going to the rack can be maintained below a certain threshold by a control method to ensure proper functioning of the components in the rack.

Figure 3:
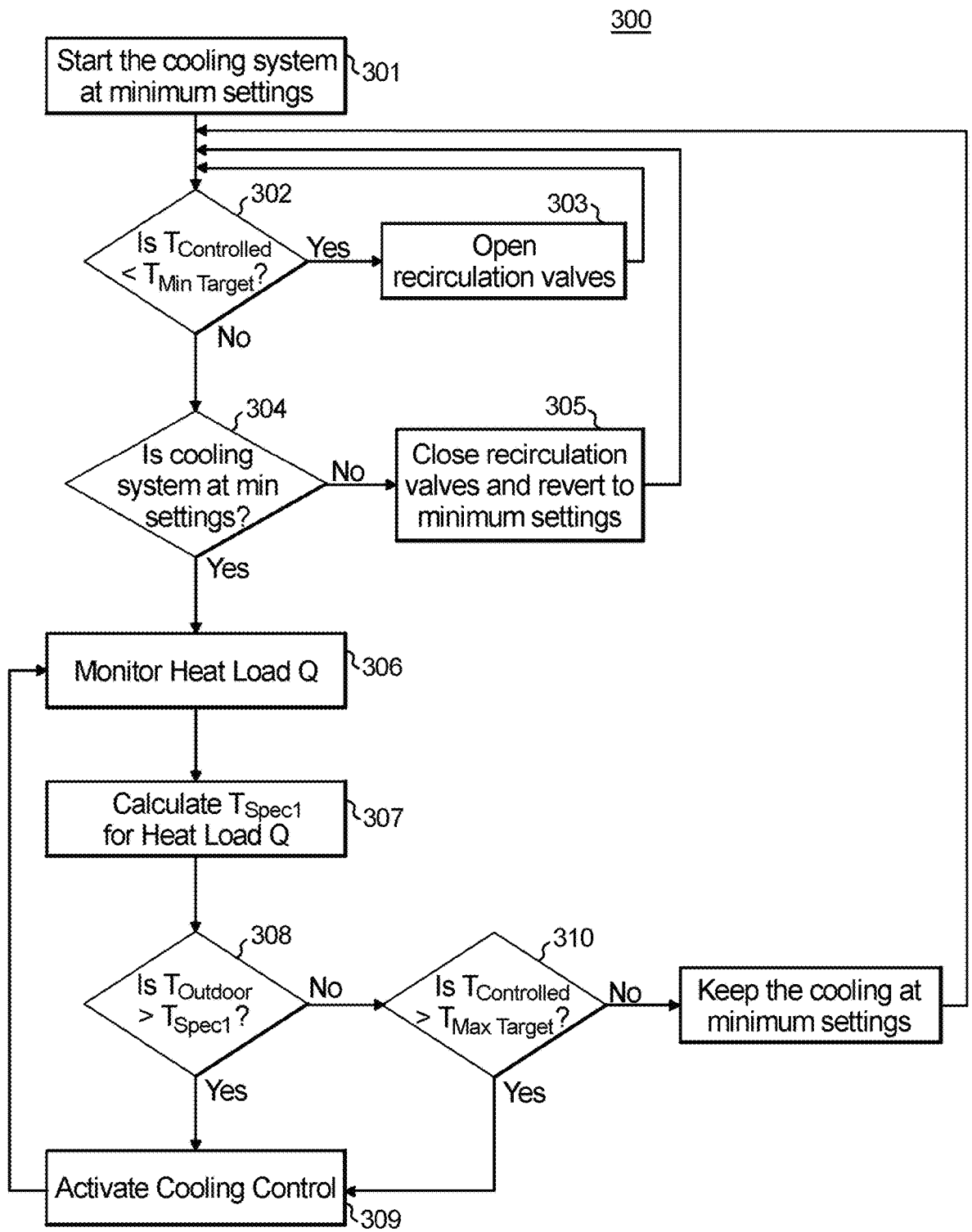
FIG. 3 is a flow diagram depicting an exemplary method for controlling a cooling system according to an embodiment of the present disclosure.

According to an exemplary embodiment of the present disclosure, a method 300 for controlling a cooling system is shown in FIG. 3. Referring to FIG. 3, the cooling system operates at a specified minimum cooling power setting 301 as long as the temperature being controlled ($T_{Controlled}$), e.g., the rack inlet coolant temperature is between a minimum temperature target ($T_{Min\ Target}$) (at block 302) and a maximum temperature target ($T_{Max\ Target}$) (at block 310). For example, the rack inlet coolant temperature can be controlled between the $T_{Min\ Target}$ and the $T_{Max\ Target}$ for any given outdoor weather condition and power workload.

It should be understood that the temperature being controlled ($T_{Controlled}$) can refer to a temperature that is monitored, and that can be controlled in certain circumstances.

Figure 4:
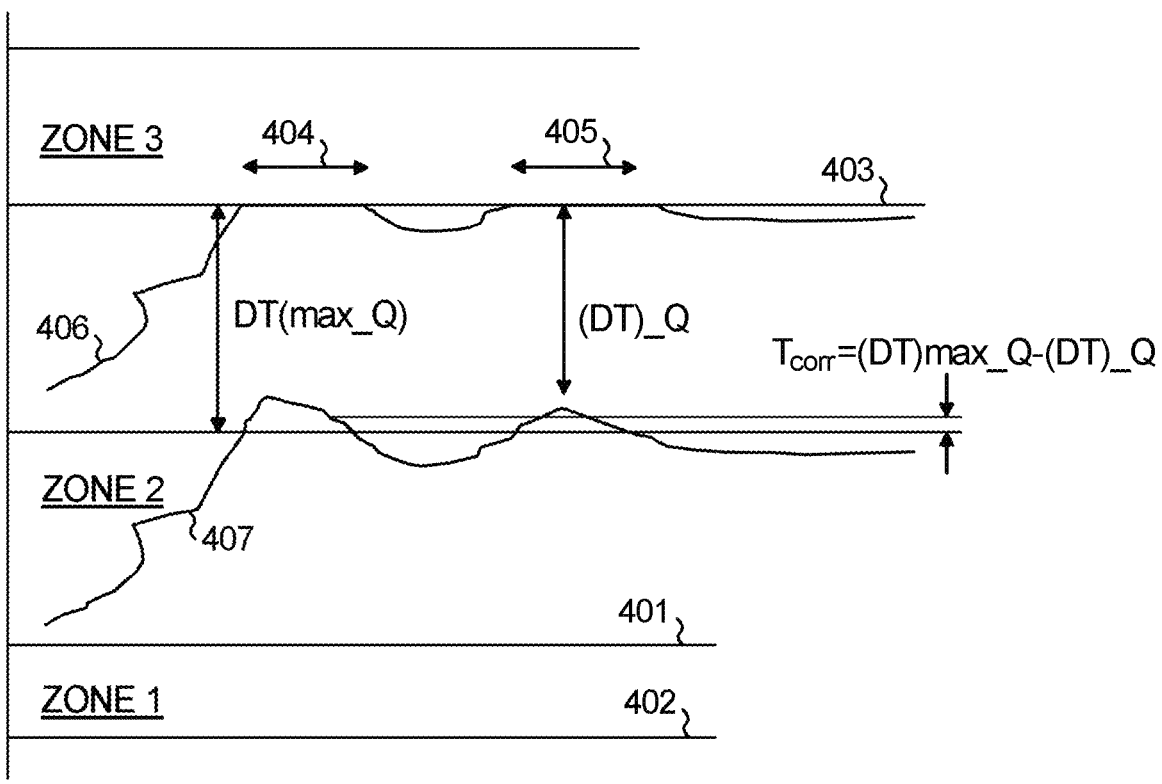
FIG. 4 is a graph illustrating temperature controls on a rack inlet coolant temperature according to an embodiment of the present disclosure.

Referring to FIG. 4, $T_{Min\ Target}$ 401 is a temperature defining zone 1, and can be set at or above a dew point 402 (e.g., the dew point inside the rack). $T_{Max\ Target}$ 403 is a temperature (e.g., 38 degrees Celsius) defining zone 3 below a maximum temperature of the rack equipment (e.g., 40 degrees Celsius); temperature controls can be engaged at $T_{Max\ Target}$ 403. That is, zone 3 represents the buffer or safety margin of the rack equipment below the maximum temperature. As shown In FIG. 4, controls are engaged when $T_{Controlled}$ 406 reaches $T_{Max\ Target}$ 403 at times 404 and 405, wherein $T_{Controlled}$ 406 can be maintained at $T_{Max\ Target}$ 403.

Referring again to FIG. 3, the cooling system is started at a specified minimum cooling power setting at block 301. For example, in the exemplary cooling system of FIG. 2, a minimum setting may be 6 gallons per minute (gpm—convertible to liters per minute by multiplying by 3.79) for an internal loop flow rate, 4 gpm for an external loop flow rate, 150 revolutions per minute (rpm) for an outdoor heat exchanger fan speed, and a recirculation valve fully closed. This exemplary minimum setting can be a global minimum for the cooling system, a user selectable input, etc. If $T_{Controlled}$ reaches the $T_{Min\ Target}$ at block 302, the cooling system enters a winter mode operation and opens a recirculation valve (see 104, FIG. 1 or 205, FIG. 2) to maintain the cooling system above the dew point at block 303. If the $T_{Controlled}$ increases above the $T_{Min\ Target}$ the cooling system is at the specified minimum cooling power setting (at block 304), the recirculation valve is closed at block 305. At block 306, the heat load, Q, into the cooling system is measured. At block 307, the heat load, Q, is used to determine the $T_{Spec1}$ temperature. Here, for example, $T_{Spec1} = T_{Max\ Target} - (DT)max\_Q$, for a given heat load Q. At block 308, $T_{Outdoor}$ can be compared to the $T_{Spec1}$, and if $T_{Outdoor}$ is below the $T_{Spec1}$, control passes to block 310 where $T_{Controlled}$ can be compared to $T_{Max\ Target}$. At block 310, if $T_{Controlled}$ is below the $T_{Max\ Target}$, the cooling system operates at its minimum cooling power setting. At block 308, if $T_{Outdoor}$ is above the $T_{Spec1}$ or at block 310, if $T_{Controlled}$ is above the $T_{Max\ Target}$, an active control can be engaged at block 309 to control the cooling system to maintain $T_{Controlled}$ at or below the $T_{Max\ Target}$. For example, an external loop pump flow rate and an outdoor heat exchanger fan speed can be changed proportionately to keep $T_{Controlled}$ at or about $T_{Max\ Target}$ as shown in FIG. 4 at times 404 and 405.

It should be understood that the cooling system maintains $T_{Controlled}$ at or below the $T_{Max\ Target}$, wherein "at" should be understood to include temperature values about the $T_{Max\ Target}$, for example, plus or minus 0-1 degrees Celsius, plus or minus 0-5 degrees Celsius, plus or minus 2-5 degrees Celsius, etc. Of course, these tolerances can be variously designed into a cooling system by one of ordinary skill in the art in view of the present disclosure. Therefore, in the context of the maintaining $T_{Controlled}$ at or below the $T_{Max\ Target}$, the $T_{Controlled}$ temperature should not be interpreted to be exactly $T_{Max\ Target}$ unless explicitly stated.

As shown above, the exemplary method of FIG. 3, as illustrated in FIG. 4, results in three distinct zones of control, shown as zone 1, zone 2 and zone 3 in FIG. 4. Zone 1 exists below $T_{Min\ Target}$ 401, in which the cooling system operates to maintain the coolant temperature above the dew point 402, for example, by opening a by-pass/recirculation valve. Zone 2 exists above $T_{Min\ Target}$ 401 and below $T_{Max\ Target}$ 403. In zone 2 the cooling system operates in an energy efficient cooling mode to optimize the cooling power. That is, if $T_{Controlled}$ is between $T_{Min\ Target}$ 401 and $T_{Max\ Target}$ 401 $T_{Controlled}$ is allowed to drift and the cooling system operates at the specified minimum setting. Zone 3 exists above $T_{Max\ Target}$ 403. In zone 3 the cooling system's control is applied to control the cooling elements to maintain $T_{Controlled}$ 406 at $T_{Max\ Target}$ 403 in an energy efficient manner. More particularly, if either the $T_{Outdoor}$ goes above $T_{Spec1}$ or the $T_{Controlled}$ reaches or exceeds $T_{Max\ Target}$, the external loop pump flow rate and the outdoor heat exchanger fans speed can be changed in an energy efficient manner between the specified minimum and maximum settings to keep $T_{Controlled}$ at or below $T_{Max\ Target}$. For example, in the exemplary cooling system of FIG. 2, a maximum setting may be 6 gpm for the internal loop flow rate, 10 gpm for the external loop flow rate, 750 rpm for the outdoor heat exchanger fan speed, and the recirculation valves fully closed.

In view of the foregoing and according to an exemplary embodiment of the present disclosure, a control can be determined and applied by the cooling system to provide a certain cooling or temperature delta (e.g., the difference between $T_{Controlled}$ and $T_{Outdoor}$) at a specific temperature and with a lowest total cooling energy.

Figure 5:
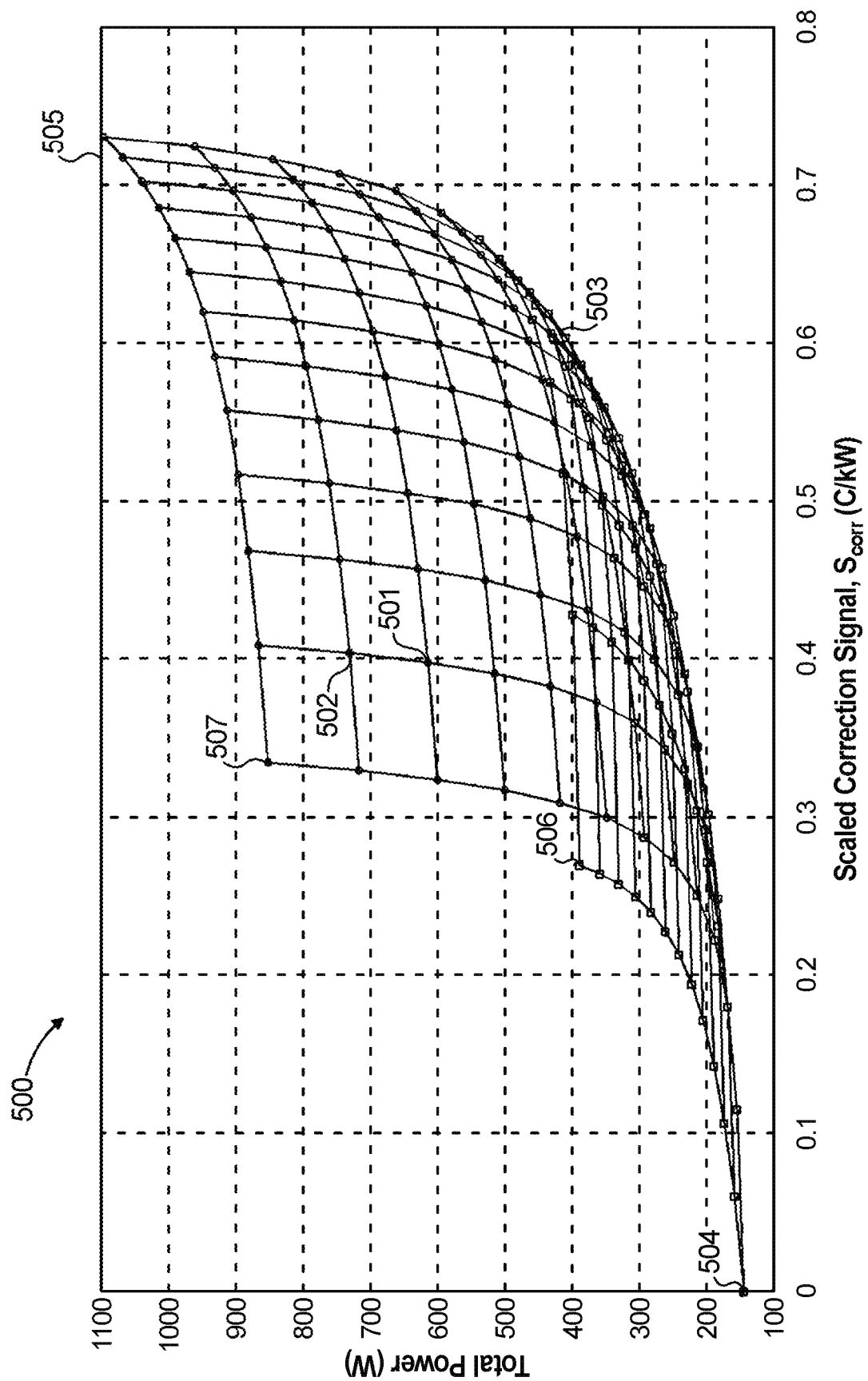
FIG. 5 is a graph of total cooling power according to an embodiment of the present disclosure.

FIG. 5 is a graph 500 showing a plurality of nodes, each node representing a distinct flow rate and fan speed combination. Each node is associated with a total power required for the corresponding flow rate and fan speed, and a resulting $S_{Offset}$. A plurality of energy paths exist between the nodes. Each energy path, e.g., from node 501 to node 502, is associated with changing either the flow rate of the pump or the speed of the fan from one state to another while keeping the other cooling component at a fixed state.

According to an exemplary embodiment of the present disclosure, a least energy solution 503 is determined from a minimum cooling energy state at node 504 to a maximum cooling energy state at node 505 of the cooling system. That is, a least energy solution 503 is a state of greatest $S_{Offset}$ for a lowest total power. It should be understood that there may exist one or more least energy solutions for any cooling system, depending on for example, the components of the system, the $T_{Outdoor}$, etc. That is, a least energy solution is a non-limiting expression of an energy curve that may be a function of any type or number of inputs and user constraints.

By way of comparison, an energy path from node 504 to node 506 represents the increasing of the flow rate from 4 gpm at node 504 to 10 gpm at node 506, while the fan speed remains the same at 150 rpm. Similarly, an energy path from node 507 to node 505 represents the increasing of the fan speed from 150 rpm at node 507 to 750 rpm at node 505, while the flow rate remains the same at 10 gpm.

Further, it can be seen that a total power of a pump operating at a maximum flow rate and a fan speed at a lowest rpm (e.g., at node 506) uses a total power of less than about 400 watts (W) while the pump operating at a minimum flow rate and the fan speed at a highest rpm (e.g., at node 507) uses a total power of about 850 W. It can also be seen that the scaled correction signal, $S_{Corr}$, differs by only about 0.03 between node 506 and node 507.

Given a determined least energy solution 503, the cooling system can be controlled to approach or achieve a least energy solution 503. For example, by toggling between different paths created by the individual cooling components of the cooling system, the cooling system can approach or achieve a minimum total cooling power for any level of cooling or temperature delta.

Methods for controlling a cooling system according to a determined least cooling energy path can be variously implemented. For example, a control method can be programmed onto a programmable logic controller (PLC) unit controlling individual components of the cooling system such as an outdoor heat exchanger fan and a liquid coolant pump. In another example, a control method can be run on a remote computer, which takes in input information from a data center being cooled and outputs control signals for controlling the heat rejection unit.

Figure 6A:
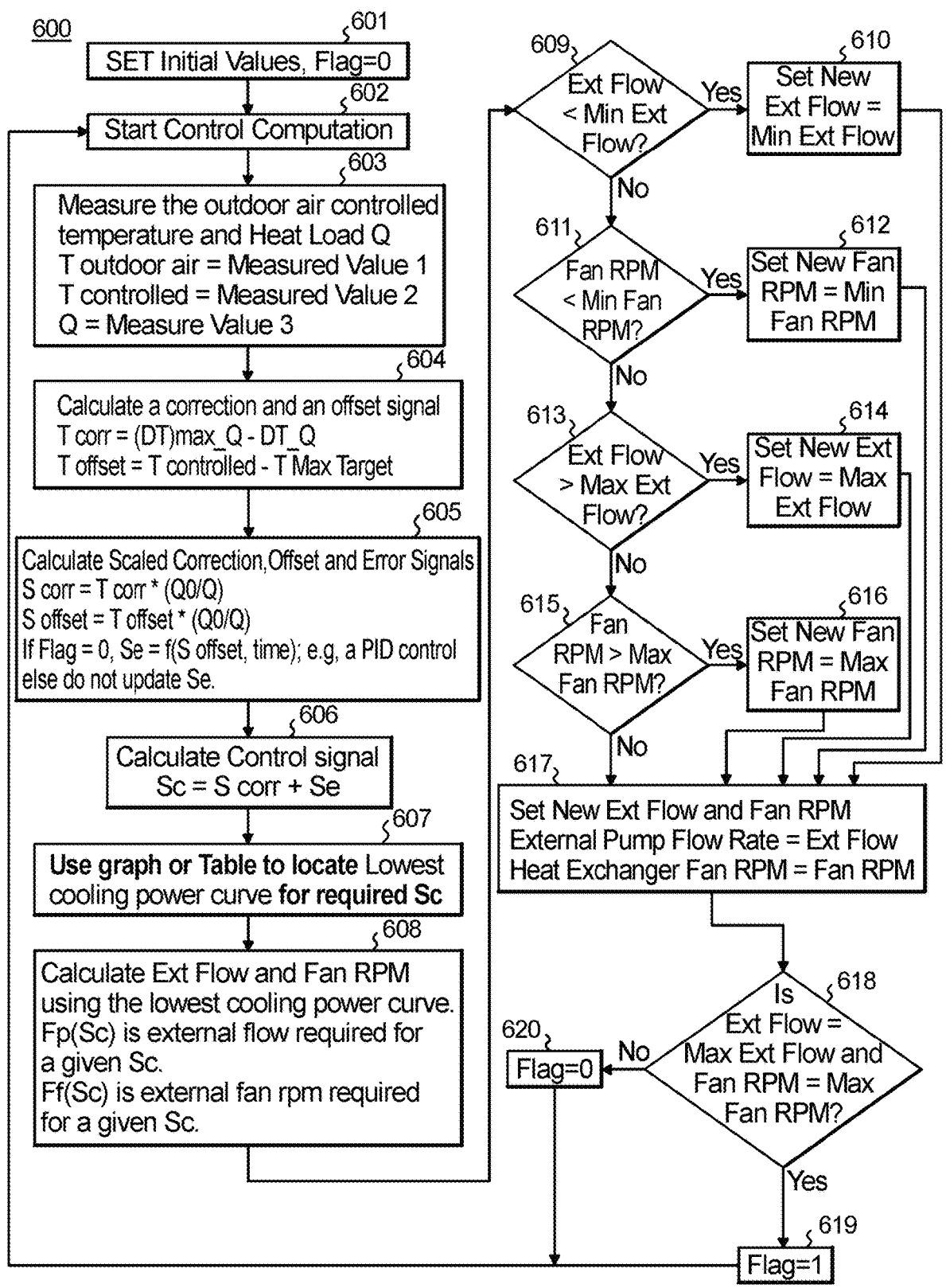
FIG. 6A is a flow diagram depicting an exemplary method for controlling a cooling system according to an embodiment of the present disclosure.

FIG. 6A is an exemplary method 600 for regulating an external loop flow rate and an outdoor heat exchanger fan speed according to an embodiment of the present disclosure. At block 601, initial values are set. These initial values can include minimum and maximum values for pump flow rate, and minimum and maximum values for fan speed. These initial values can further include an internal pump flow rate (e.g., a fixed gpm value), a $T_{Max\ Target}$ input by a user (e.g. 38 degrees Celsius), and a $T_{Min\ Target}$ input by the user or determined in-situ using a temperature sensor and a humidity sensor. The initial values can further include a maximum and a minimum temperature delta (e.g., $T_{Controlled}-T_{Outdoor}$ at minimum cooling settings for Q0=(DT)max_Q0, $T_{Controlled}-T_{Outdoor}$ at minimum cooling settings for Q=(DT)max_Q=(DT)max_Q0*(Q0/Q), $T_{Controlled}-T_{Outdoor}$ at maximum cooling settings for Q0=(DT)min_Q0, $T_{Controlled}-T_{Outdoor}$ at maximum cooling settings for Q=(DT)min_Q=(DT)max_Q0*(Q0/Q)). The initial values can further include an initial $T_{Spec1}$ (e.g., $T_{Spec1}=T_{Max\ Target}-$(DT)max_Q). These and other initial values can be included in the initialization at block 601.

At block 602, a control is determined for application to the cooling system, for example, to control a rack inlet temperature.

At block 603, parameters including an outdoor air temperature (e.g., $T_{Outdoor}$=Measured Value 1), a temperature being controlled (e.g., rack inlet coolant temperature expressed as $T_{controlled}$=Measured Value 2), and a heat load (e.g., expressed as Q=Measured Value 3) can be measured. Further, (DT)max_Q and $T_{Spec1}$ (e.g., $T_{Spec1}=T_{Max\ Target}-$(DT)max_Q), and DT_Q are determined (e.g., DT_Q= $T_{Max\ Target}-T_{Outdoor}$ (for $T_{Outdoor}>T_{Spec1}$, for Q).

At block 604, a correction signal (e.g., $T_{Corr}$=(DT)max_Q-DT_Q) and an offset signal (e.g., $T_{Offset}=T_{Controlled}-T_{Max\ Target}$) can be determined.

At block 605, a scaled correction signal (e.g., $S_{Corr}=T_{Corr}*(Q0/Q)$), scaled offset signal (e.g., $S_{Offset}=T_{Offset}*(Q0/Q)$), and an error signal (e.g., error signal, Se=f($S_{Offset}$, time)) can be determined. Herein, if a flag=0, Se=f($S_{Offset}$, time); else do not update Se. The error signal, Se may be evaluated using either a Proportional (P−) control, or a Proportional-Integral (PI−) control or a Proportional-Integral-Derivative (PID−) control. If using a PI-control, the error signal may be given as Se=Gain*$S_{Offset}$, where for example, Gain can be 1. If using a PI-control, the error signal can be expressed as $$Se = \text{Gain} * S_{Offset} + C0 * \int_0^{time} S_{Offset}(\tau)d\tau,$$

where for example, Gain could be 5 and C0 could be 0.2. If using a PID control, the error signal could be expressed as $$Se = \text{Gain} * S_{Offest} + C0 * \int_0^{time} S_{Offset}(\tau)d\tau + C1 * \frac{dS_{Offset}(\text{time})}{d(\text{time})},$$

where for example, Gain could be 5, C0 could be 0.2 and C1 could be 2.

A control signal can be determined at block 606, for example, as $Sc=S_{Corr}+Se$.

At block 607, a lowest cooling power curve is received or determined for a given Sc. The lowest cooling power curve corresponds to a lowest energy solution.

At block 608, the control signal can be selectively applied to the controlled components, for example, a pump and a fan. For example, a pump flow rate and a fan speed can be determined using a lowest energy solution, and a control temperature can be divided proportionately between the pump and the fan (e.g., at any appropriate ratio). If the control signal provided to a first component (e.g., a pump p) is independent of the control signal provided to a second component (e.g., a fan f), then $Tp=Sc*Ap/Tpf$ (e.g., $Tp=Sc*5/12.5$) and $Tf=Sc*Af/Tpf$ (e.g., $Tf=Sc*7.5/12.5$), where Tpf=maximum control signal achievable by changing pump flow rate and fan speed settings, Ap=maximum control signal achievable by changing the pump flow rate, and Af=maximum control signal achievable by changing the fan speed settings.

This dependence of Tp and Tf on Sc can be altered based on the cooling system to achieve an optimum cooling energy use.

Further, at block 608, the pump flow rate (e.g., Ext Flow) and fan speed (e.g., Fan RPM) can be determined. Fp(Tp) is external flow required for a given Tp. For example, $Fp=37.43*((-1.0916*Tp+9.1526)^{-1.01})$. Ff(Tf) is external fan rpm required for a given Tf. For example, $Ff=669.33*((-0.7107*Tf+6.2004)^{-0.8197})$.

For the following discussion, Ext Flow=Fp (Tp) and Fan RPM=Ff (Tf).

At blocks 609-617, limits on maximum and minimum pump speed and fan speed at set. At block 609, if Ext Flow<Min Ext Flow then Ext Flow=Min Ext Flow at block 610. At block 611, if Fan RPM<Min Fan RPM then Fan RPM=Min Fan RPM at block 612. At block 613, if Ext Flow>Max Ext Flow then Ext Flow=Max Ext Flow at block 614. At block 615, if Fan RPM>Max Fan RPM then Fan RPM=Max Fan RPM at block 616. At block 617, New Ext Flow and Fan RPM can be set, where External Pump Flow Rate=Ext Flow and Heat Exchanger Fan RPM=Fan RPM.

At block 618, if Ext Flow and Fan RPM at both at maximum values, then the flag can be updated, e.g., to 1, else the flag is maintained, e.g., at 0, and the flow returns to block 602.

Figure 6B:
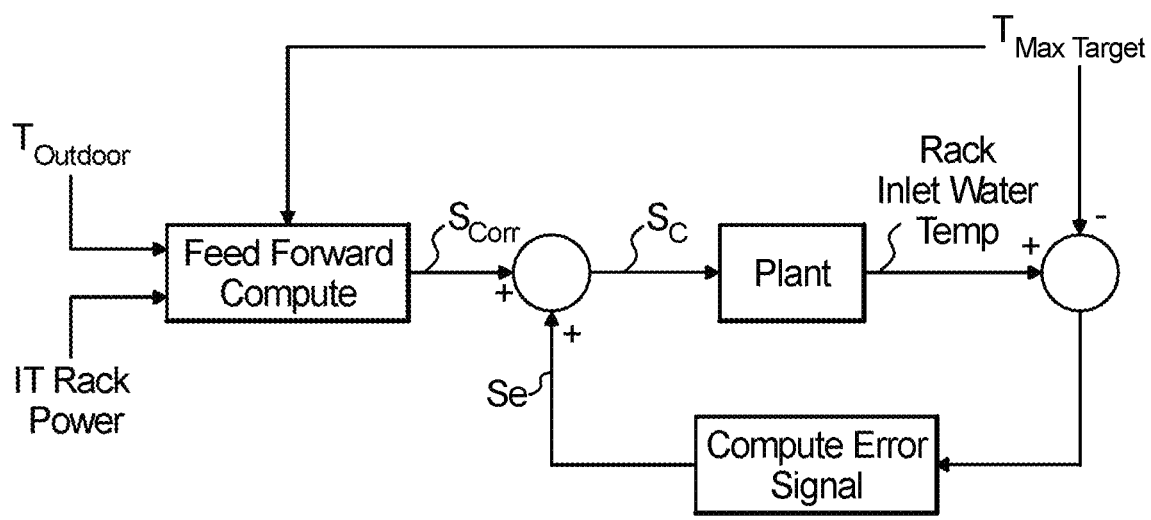
FIG. 6B is a block diagram showing exemplary signals for an exemplary cooling system according to an embodiment of the present disclosure

Referring to FIG. 6B, the outdoor ambient air temperature, the IT Rack Power and the $T_{Max\ Target}$ can be used to determine a feed forward signal as the scaled correction signal, $S_{Corr}$. The $T_{Max\ Target}$ and the control data can be used to determine the error signal Se. FIG. 6B shows a plant module 601, a feed forward module 602 and an error signal module 603. The plant module 601 can include the various components of the cooling system receiving a control signal, Sc. The feed forward module 602 can receive $T_{Max\ Target}$, $T_{Outdoor}$, and rack power data and determine a scaled correction signal, $S_{Corr}$. The error signal module 603 can receive control data and outputs an error signal, Se, which can be combined with the scaled correction signal, $S_{Corr}$, to determine the control signal, Sc, for controlling the plant module 601.

According to an exemplary embodiment of the present disclosure, a control method seeks a lowest energy solution for a required control signal, Sc. Two exemplary scenarios will be considered below including a first scenario in which the changes in flow rates or fan rpm required from one cooling component to produce a certain temperature delta is strongly coupled to the flow rate or fan rpm of another cooling component, and a second scenario in which the changes in flow rates or fan speed are un-related or uncoupled.

Coupled Examples

Considering a coupled set of equations for cooling energy optimization for inter-related fans speed and pump flow rate dependence on Control Signal, Sc, according to an exemplary embodiment of the present disclosure, a cooling components setting can be determined that provides the required control temperature with a lowest energy solution.

Referring again to FIG. 5, the least cooling energy path 501 can be followed from the minimum cooling energy state, e.g., node 504, to the maximum cooling energy state, e.g., node 505, by toggling between the different paths of the cooling components (e.g., a fan and a pump) to have a minimum total power for any given control temperature. Each path here could mean changing a parameter (e.g., flow rate, speed, % open, etc.) of a cooling component from one state to another state, while keeping parameters of all other cooling components fixed.

Figure 7:
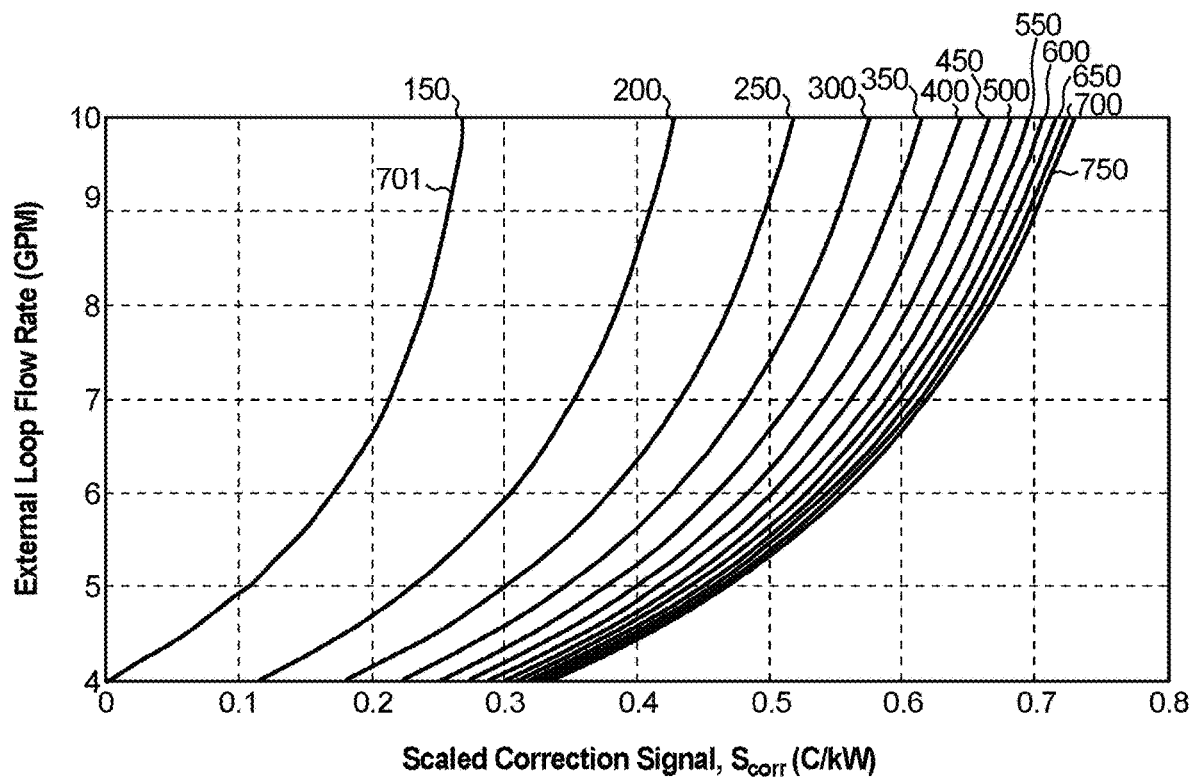
FIG. 7 is a graph of flow rate versus a control signal for a pump component at different fan speeds according to an embodiment of the present disclosure.
Figure 8:
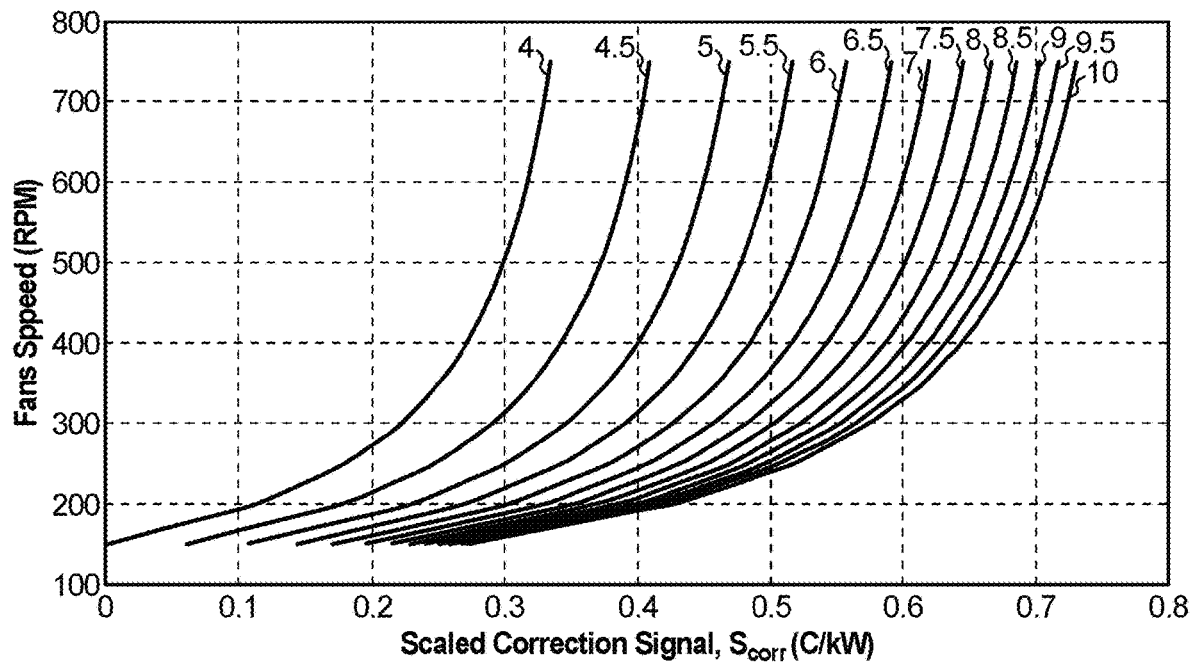
FIG. 8 is a graph of fan speed versus a control signal for a fan component at different coolant flow rates according to an embodiment of the present disclosure.

More particularly, the parameters of the cooling component needed to provide a certain control signal (Sc) can be plotted for different settings of all other cooling components. For example, FIG. 7 shows flow rates (gpm) and FIG. 8 shows speed (rpm) at different scaled correction signals. Consider the example of curve 701 in FIG. 7, where the fan speed is constant at 150 RPM and the flow rate varies from 4 to 10 gpm when the control signal varies from 0 to ~0.27. Since each flow rate or speed setting has a corresponding power associated with it, these flow rate/speed curves versus Sc can be used to generate the total cooling power versus Sc curves of FIG. 5. In the total cooling power versus Sc curve, the bottom most curve for any given Sc will be a lowest energy solution for that given Sc. Thus, the entire range of Sc can be explored to determine the least cooling energy curve for a given value or range of values of Sc.

According to an exemplary embodiment of the present disclosure, a method for controlling the cooling system can follow a bottom most path from node 504 to node 505 in FIG. 5, for example, by toggling between different curves to approximate a lowest energy solution for any given control signal, Sc. For example, Table 1 illustrates a sample energy efficient path from node 504 to node 505:

TABLE 1

| Control Signal (Sc) | Flow Rate (gpm) (Exterior Loop) | Fan Speed (rpm) |
|---|---|---|
| 0 <= Sc <= 0.18 | 4 | 150 rpm to 250 rpm |
| 0.18 < Sc <= 0.345 | 4-5.5 | 250 |
| 0.345 < Sc <= 0.39 | 5.5 | 250-300 |
| 0.39 < Sc <= 0.48 | 5.5-7 | 300 |
| 0.48 < Sc <= 0.52 | 7 | 300-350 |
| 0.52 < Sc <= 0.56 | 7-8 | 350 |
| 0.56 < Sc <= 0.59 | 8 | 350-400 |
| 0.59 < Sc <= 0.63 | 8-9.5 | 400 |
| 0.63 < Sc <= 0.65 | 9.5 | 400-450 |
| 0.65 < Sc <= 0.66 | 9.8-10 | 450 |
| 0.66 < Sc <= 0.73 | 10 | 450-750 |

Table 1 is an exemplary piecewise method. One of ordinary skill in the art would appreciate that other methods may be used to approach the minimum total power, for example, using a proportionality constants for the flow rate and the fan speed for certain control signals (e.g., see Table 2), or a particular solution can be described by a single equation.

TABLE 2

| Control Signal (Sc) | Flow Rate (gpm) (Exterior Loop) | Fan Speed (rpm) |
|---|---|---|
| 0 <= Sc <= 0.18 | 4 | 150 to 250 |
| 0.18 < Sc <= 0.66 | 4-10 | 250 to 450 |
| 0.66 < Sc <= 0.73 | 10 | 450 to 750 |

In the case of Table 2, the proportionality constants can be chosen so as to approximate a lowest energy solution from minimum cooling settings to maximum cooling energy settings.

Uncoupled Examples

In yet another exemplary embodiment, a method for approximating a lowest energy solution can be implemented using an un-coupled set of equations. In this case, a cooling energy minimization can be determined for non-related fan speed and pump flow rate depending on control signal, Sc or control temperature, Tc. Control temperature, Tc can be defined as Control Signal (Sc)*Heat Load (Q). Two exemplary implementations will be described below.

In a first exemplary implementation, a control signal or control temperature can be divided proportionately between the pump and fan. If the control temperature is provided by one component is independent of the other, then:

$Tp=Tc*Ap/Tpf$ ... (for example, $Tp=Tc*5/12.5$)

$Tf=Tc*Af/Tpf$ ... (for example, $Tf=Tc*7.5/12.5$).

The dependence of Tp and Tf on Sc or Tc can be altered based on the cooling system to achieve an optimum cooling energy use.

Figure 9A:
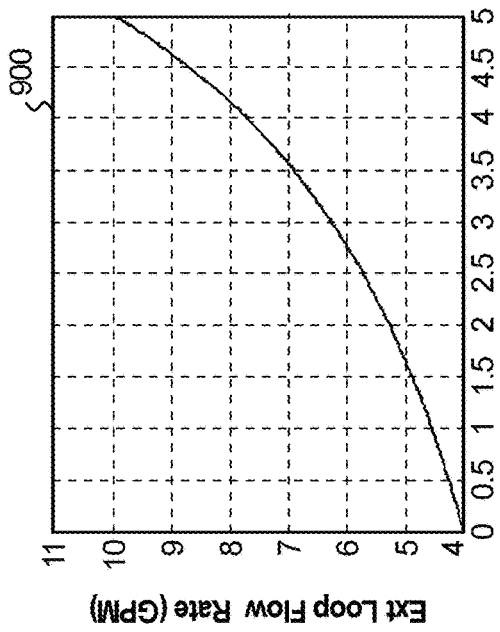
FIG. 9A is a graph of pump flow rate $F_p(T_p)$ as functions of a temperature delta from a pump, $T_p$, according to an embodiment of the present disclosure.
Figure 9B:
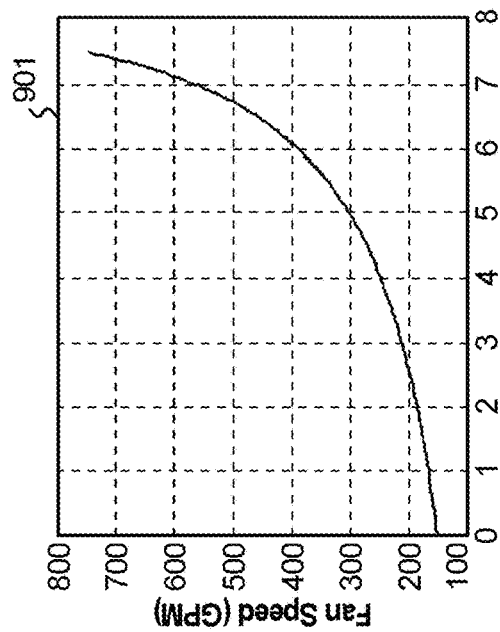
FIG. 9B is a graph of fan speed $F_f(T_f)$ as functions of a temperature delta from a fan, $T_f$, according to an embodiment of the present disclosure.

FIGS. 9A-B show the graph of sample Fp(Tp) 900 and Ff(Tf) 902 for an exemplary cooling system. According to these functions, to achieve a 3 degree change (Celsius) from the pump, the pump flow rate needs to be changed from 4 gpm to about 6.3 gpm, and to achieve a 3 degree change from the fan, the fan speed needs to be changed from 150 RPM to ~210 RPM. To achieve a further 1 degree change from the pump, the pump flow rate needs to be changed from about 6.3 gpm to about 7.8 gpm, and to achieve further 1 degree change from the fan, the fan speed needs to be changed from about 210 RPM to about 250 RPM.

Figure 10A:
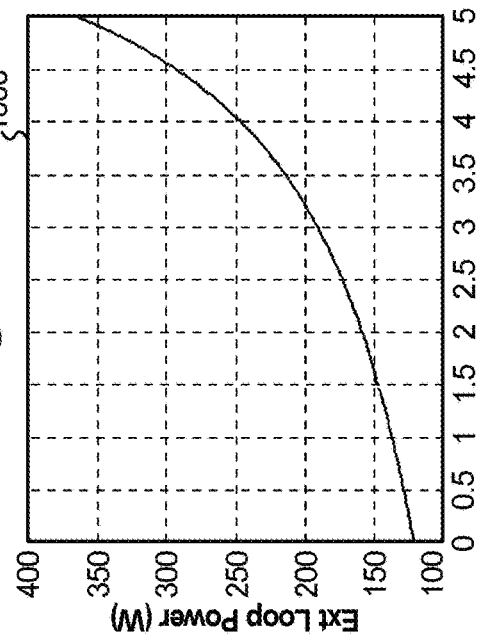
FIG. 10A is a graph of pump power, $P_p(T_p)$ as functions of a temperature delta from a pump, $T_p$, according to an embodiment of the present disclosure.
Figure 10B:
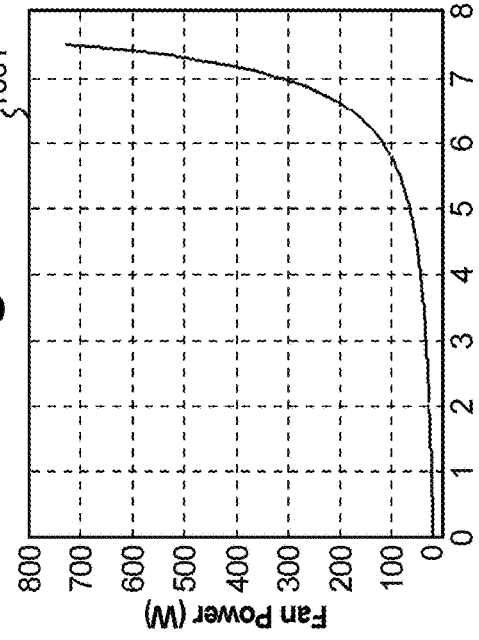
FIG. 10B is a graph of fan power $P_f(T_f)$ as functions of a temperature delta from a fan, $T_f$, according to an embodiment of the present disclosure.

FIGS. 10A-B show the graph of sample Pump Power, Pp(Tp) 1000 and Fan Power, Pf(Tf) 1001 as functions of Temperature delta needed from the pump, Tp and from the fans, Tf, respectively.

Figure 11:
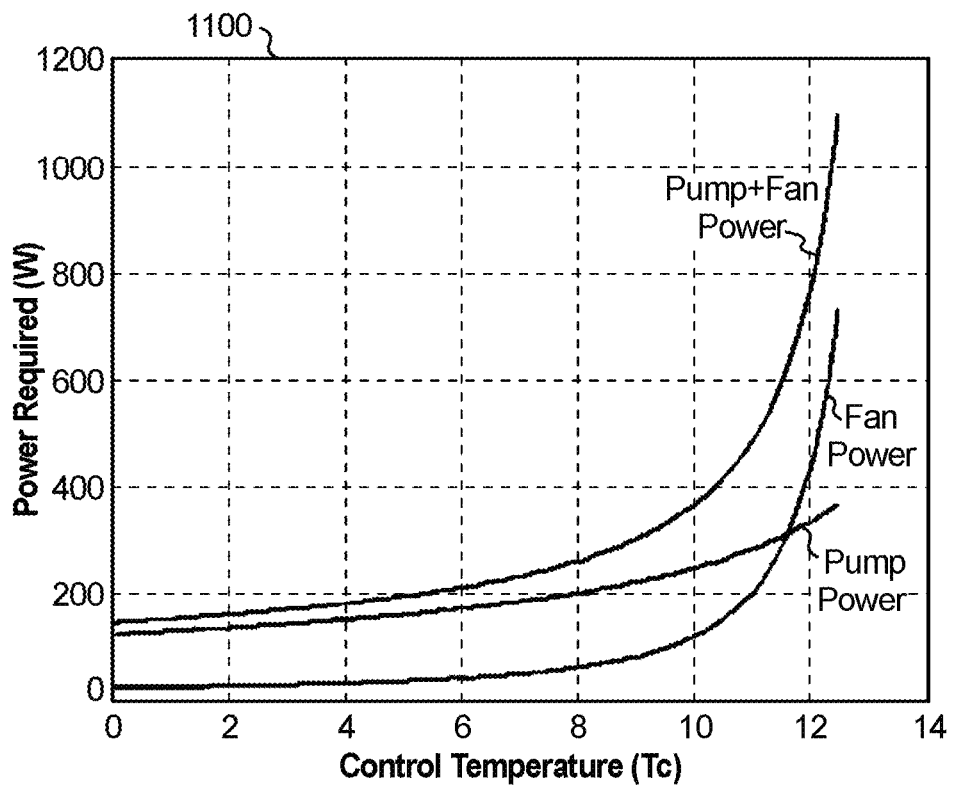
FIG. 11 is a graph of a total cooling power curve when a control temperature Tc is proportionately divided among the pump and the fan according to an embodiment of the present disclosure.

FIG. 11 shows a graph 1100 of a total cooling power curve when a control temperature Tc is proportionately divided among the pump and the fan. The measure of total cooling energy efficiency from Tc=0 to Tc=Tc,max is the area under the total cooling power curve. Smallest area is equivalent to the most energy efficient the cooling energy solution.

In addition to the proportional distribution of control temperature (Tc) between Tp and Tf, there are many other methods of distribution.

Figure 12:
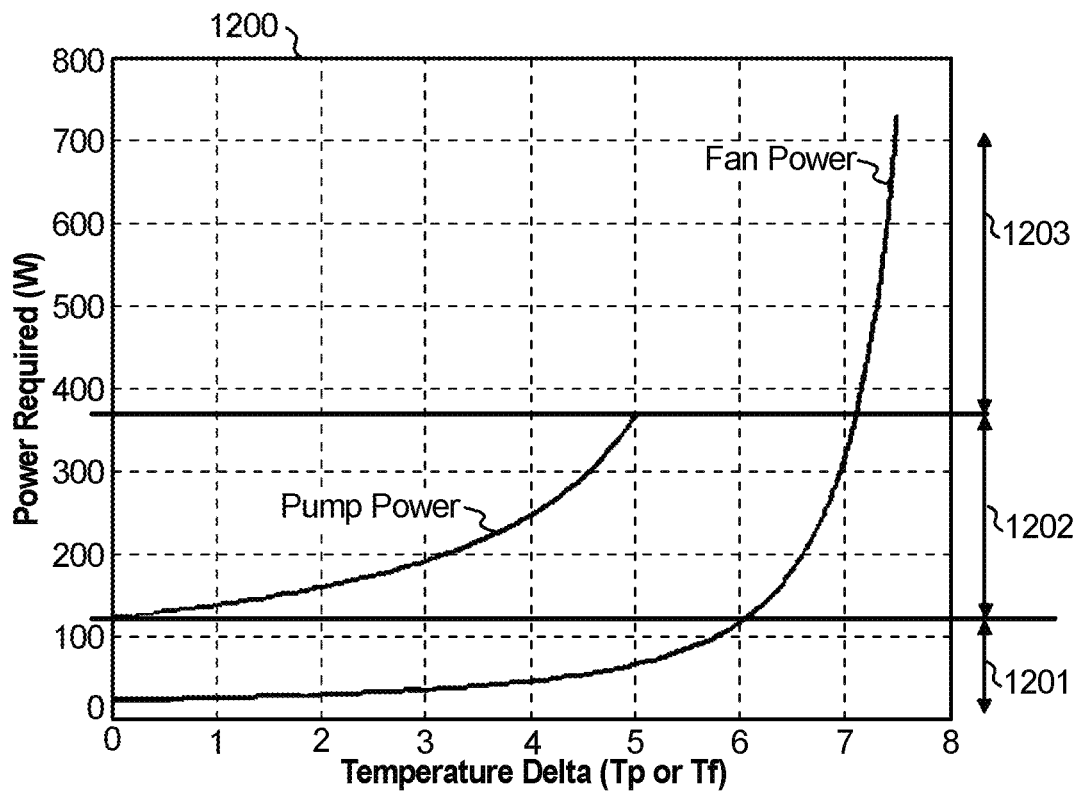
FIG. 12 is a graph of a minimum and maximum range of power consumption for the individual cooling components according to an embodiment of the present disclosure.

In a second exemplary implementation, a minimum and maximum range of power consumption can be determined for the individual cooling components as shown in FIG. 12, 1200. For example, find the following:

1) Min 1=minimum Pump Power (Pp) at minimum settings and Fan Power (Pf) at minimum settings
2) Min 2=maximum Pp at minimum settings and Pf at minimum settings
3) Max 1=minimum Pp at maximum settings and Pf at maximum settings
4) Max 2=maximum Pp at maximum settings and Pf at maximum settings Temperature break points can be determined, for example, as:

T1=non-zero and non-negative Tp or Tf (which ever is applicable) @ Min 2 power.

T2=non-zero and non-negative Tp or Tf (which ever is applicable) @ Max 1 power.

For example, if the Min 1 corresponds to Pf @ Tf=0, then Min 2=Pp @ Tp=0, so T1 is the temperature at which Pf=Min 2 (that is, Pf=Min 2 @ Tf=T1). If Max 1 corresponds to Pp @ Tp=max(Tp), then T2 is the temperature at which Pf=Max 1 (that is, Pf=Max 1 @ Tf=T2).

As shown in FIG. 12, the control signal or temperature can be divided between flow rate and fan speed, resulting in three regions 1201-1203, including Min 1 to Min 2 1201, Min 2 to Max 1 1202, and Max 1 to Max 2 1203, in terms of power. In terms of control signal, these three regions could be represented as Tc=0 to T1, T1 to T3 and T3 to Tc,max, where T3=(Tp,max−T1+T2) if Max 1=Pp at Tp, max, or
T3=(Tf,max−T1+T2) if Max 1=Pf at Tf,max.

In region 1, Tc=0 to T1
1. If Min 1=Pp at Tp=0, then; Tf=0, Tp=Tc for all Tc∈[0, T1]
2. Else if Min 1=Pf @ Tf=0, then; Tp=0, Tf=Tc for all Tc∈[0, T1]

In region 2, Tc=T1 to T3
1. If Min 1=Pp @ Tp=0 and if Max 1=Pp at Tp=Tp,max, then; Tp=T1+(Tc−T1)*(Tp,max−T1)/(T3) and Tf=(Tc−T1)*(T2)/(T3) for all Tc∈(T1, T3].
2. If Min 1=Pf at Tf=0 and if Max 1=Pf at Tf=Tf,max, then; Tp=(Tc−T1)*(T2)/(T3) and Tf=T1+(Tc−T1)*(Tf, max−T1)/(T3) for all Tc∈(T1, T3].
3. If Min 1=Pf at Tf=0 and if Max 1=Pp at Tp=Tp,max, then; Tp=(Tc−T1)*(Tp,max)/(T3) and Tf=T1+(Tc−T1) *(T2−T1)/(T3) for all Tc∈(T1, T3].
4. If Min 1=Pp at Tp=0 and if Max 1=Pf at Tf=Tf,max, then; Tp=T1+(Tc−T1)*(T2−T1)/(T3) and Tf=(Tc−T1) *(Tf,max)/(T3) for all Tc∈(T1, T3].

In region 3, Tc=T3 to Tc,max
1. If Max 1=Pp at Tp=Tp,max, then; Tp=Tp,max and Tf=Tc−Tp,max−T2 for all Tc∈[T3, Tc,max].
2. Else if Max 1=Pf at Tf=Tf,max, then; Tp=Tc−Tf,max−T2 and Tf=Tf,max for all Tc∈[T3, Tc,max].

In a case where Max 1<Min 2, the more power consuming components can be identified. For example, if the Min 2 corresponds to a fan, then the fan is the more power consuming component. In this case there are only two regions, Tc=0 to T4 and T4 to Tc,max, where T4=Tp,max if Min 2=Pf at Tf=0; in this case, for region 1, Tp=Tc and Tf=0 and in region 2, Tp=Tp,max and Tf=Tc−Tp,max. Or T4=Tf, max if Min 2=Pp at Tp=0; In this case, for region 1, Tp=0 and Tf=Tc and in region 2, Tp=Tc−Tp,max and Tf=Tf,max.

FIG. 12 shows a specific example to illustrate the implementation of this method. For Example, Range of Tp=[0,5], Range of Tf=[0,7.5]=>Range of Tc=[0,12.5]. In Region 1 1201, Tp=0, Tf=Tc; ... Tc∈[0,6] (that is, first 6 degrees are provided by fans only). In Region 2 1202, Tp=(5/(5+1.1))* (Tc−6) and Tf=(1.1/(5+1.1))*(Tc−6) ... Tc∈[6,12.1] ... (that is, next 6.1 degrees are provided by pump and fans proportionately). In Region 3 1203, Tp=5 and Tf=7.1+(Tc−12.1) . . . Tc∈[12.1,12.5] . . . (that is, next 0.4 degrees are provided by the fans only).

Figure 13:
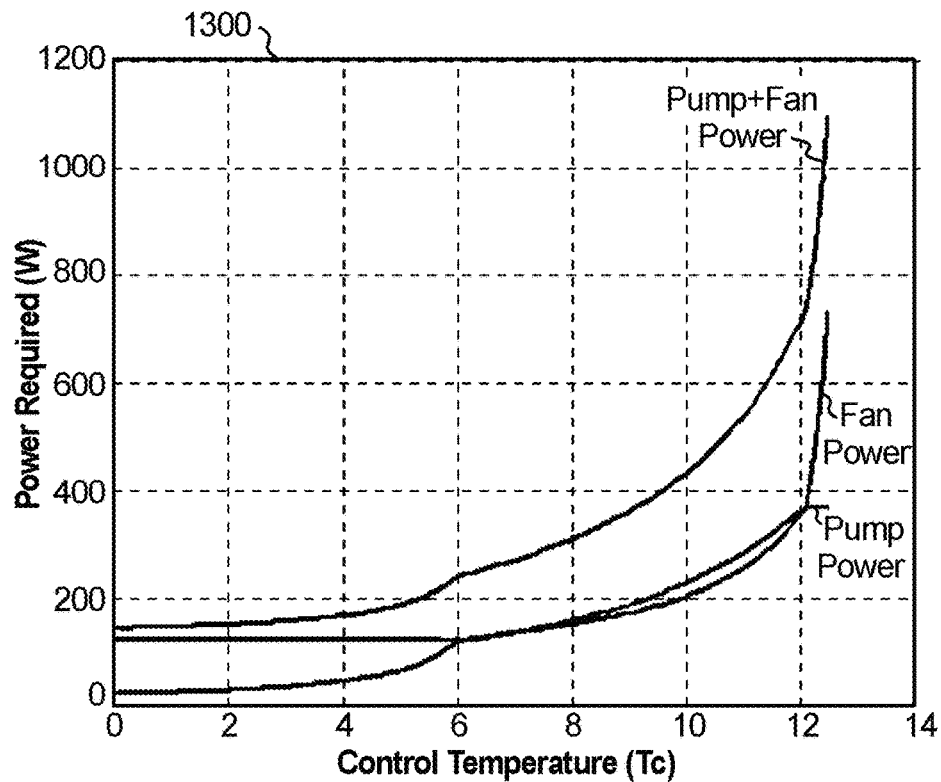
FIG. 13 is a graph of a total cooling power curve when a control temperature Tc is divided among the pump and the fan according to an embodiment of the present disclosure.

FIG. 13 shows the total cooling power curve when the second exemplary implementation of an uncoupled set of equations is applied to the same set of uncoupled equations used in the first exemplary implementation.

In a third exemplary implementation of an uncoupled set of equations, the minimum and maximum range of rate of change of power consumption by the individual cooling components can be found per degree of required temperature delta. That is, dP/dT; e.g., dPp/dTp, dPf/dTf (herein d can represent a partial derivative). For example:

1. Min 1=minimum of rate of change of Pump Power with delta T (dPp/dTp) at minimum settings and rate of change of Fan Power with delta T (dPf/dTf) at minimum settings.
2. Min 2=maximum of rate of change of dPp/dTp at minimum settings and rate of change of dPf/dTf at minimum settings.
3. Max 1=minimum of rate of change of dPp/dTp at maximum settings and rate of change of dPf/dTf at maximum settings.
4. Max 2=maximum of rate of change of dPp/dTp at maximum settings and rate of change of dPf/dTf at maximum settings.

The temperature break points can be determined as:
T1=non-zero and non-negative Tp or Tf (which ever is applicable) at Min 2, and
T2=non-zero and non-negative Tp or Tf (which ever is applicable) at Max 1.

For example, if the Min 1 corresponds to dPf/dTf at Tf=0, then Min 2=dPp/dTp at Tp=0, so T1 is the temperature at which dPf/dTf=Min 2 (that is, dPf/dTf=Min 2 at Tf=T1). If Max 1 corresponds to dPp/dTp at Tp=max(Tp), then T2 is the temperature at which dPf/dTf=Max 1 (that is, dPf/dTf=Max 1 at Tf=T2).

Figure 14:
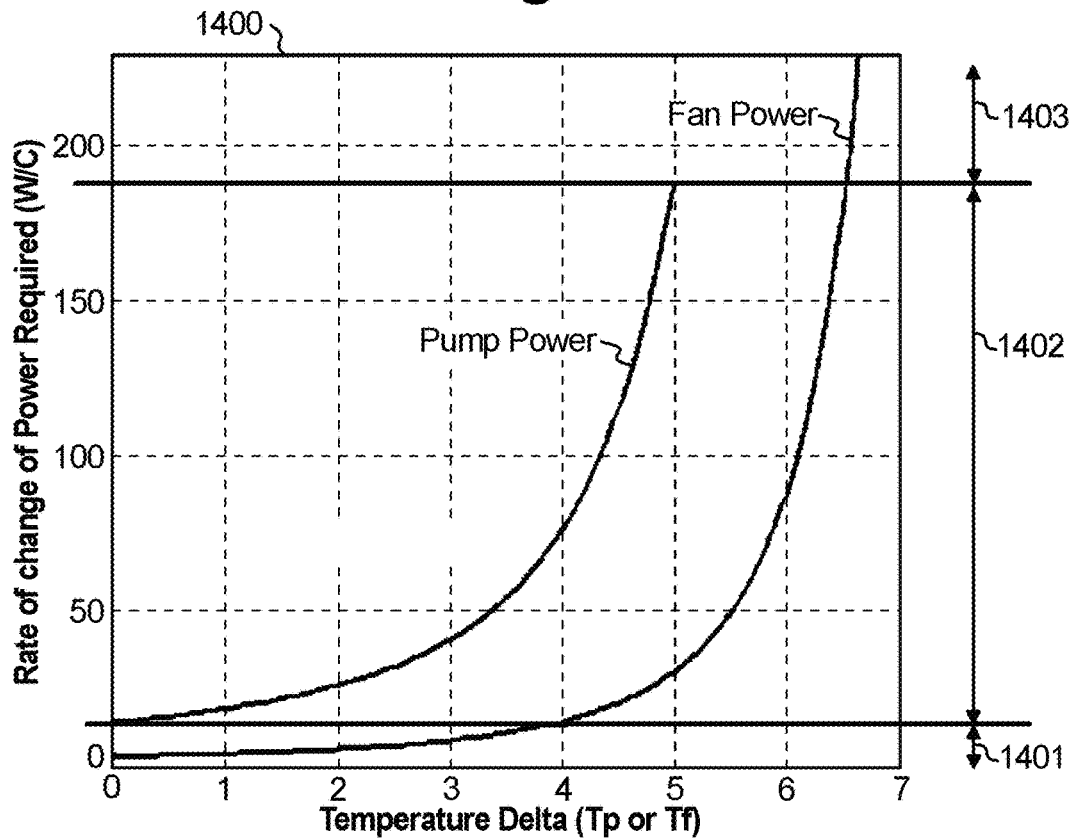
FIG. 14 is a graph of a minimum and maximum range of rate of change of power consumption per unit of temperature delta for the individual cooling components according to an embodiment of the present disclosure.

Referring to FIG. 14, a graph 1400 of the control signal or temperature can be divided between the pump and the fan, resulting in three regions, Min 1 to Min 2 1401, Min 2 to Max 1 1402, and Max 1 to Max 2 1403, in terms of rate of change of power with delta T. In terms of control temperature, these three regions could be represented as Tc=0 to T1, T1 to T3 and T3 to Tc,max, where
T3=(Tp,max−T1+T2) if Max 1=dPp/dTp at Tp,max, or
T3=(Tf,max−T1+T2) if Max 1=dPf/dTf at Tf,max.

In region 1, Tc=0 to T1

3. If Min 1=dPp/dTp at Tp=0, then; Tf=0, Tp=Tc for all Tc∈[0, T1]
4. Else if Min 1=dPf/dTf. at Tf=0, then; Tp=0, Tf=Tc for all Tc∈[0, T1]

In region 2, Tc=T1 to T3

5. If Min 1=dPp/dTp at Tp=0 and if Max 1=dPp/dTp at Tp=Tp,max, then; Tp=T1+(Tc−T1)*(Tp,max−T1)/(T3) and Tf=(Tc−T1)*(T2)/(T3) for all Tc∈(T1, T3].
6. If Min 1=dPf/Tf at Tf=0 and if Max 1=dPf/dTf at Tf=Tf,max, then; Tp=(Tc−T1)*(T2)/(T3) and Tf=T1+(Tc−T1)*(Tf,max−T1)/(T3) for all Tc∈(T1, T3].
7. If Min 1=dPf/dTf at Tf=0 and if Max 1=dPp/dTp at Tp=Tp,max, then; Tp=(Tc−T1)*(Tp,max)/(T3) and Tf=T1+(Tc−T1)*(T2−T1)/(T3) for all Tc∈(T1, T3].
8. If Min 1=dPp/dTp at Tp=0 and if Max 1=dPf/dTf at Tf=Tf,max, then; Tp=T1+(Tc−T1)*(T2−T1)/(T3) and Tf=(Tc−T1)*(Tf,max)/(T3) for all Tc∈(T1, T3].

In region 3, Tc=T3 to Tc,max

3. If Max 1=dPp/dTp at Tp,max, then; Tp=Tp,max and Tf=Tc−Tp,max−T2 for all Tc∈[T3, Tc,max].
4. Else if Max 1=dPf/dTf at Tf=Tf,max, then; Tp=Tc−Tf,max−T2 and Tf=Tf,max for all Tc∈[T3, Tc,max].

In a case where Max 1<Min 2, the more power consuming components can be identified. For example, if the Min 2 corresponds to fans, then fans are the more power consuming component. In this case there are only two regions, Tc=0 to T4 and T4 to Tc,max, where T4=Tp,max if Min 2=dPf/dTf at Tf=0; for region 1, Tp=Tc and Tf=0 and in region 2, Tp=Tp,max and Tf=Tc−Tp,max. Or T4=Tf,max if Min 2=dPp/dTp at Tp=0; In this case, for region 1, Tp=0 and Tf=Tc and in region 2, Tp=Tc−Tp,max and Tf=Tf,max.

FIG. 14 shows a specific example to illustrate the implementation of this method. For Example, Range of Tp=[0,5], Range of Tf=[0,7.5]=>Range of Tc=[0,12.5]. In Region 1 1401, Tp=0, Tf=Tc; . . . Tc∈[0,4] (that is, first 4 degrees are provided by fans only). In Region 2 1402, Tp=(5/(5+2.5))*(Tc−4) and Tf=(2.5/(5+2.))*(Tc−4) . . . Tc∈[4,11.5] . . . (that is, next 7.5 degrees are provided by pump and fans proportionately). In Region 3 1403, Tp=5 and Tf=6.5+(Tc−11.5) . . . Tc∈[11.5,12.5] . . . (that is, next 1 degree is provided by the fans only).

Figure 15:
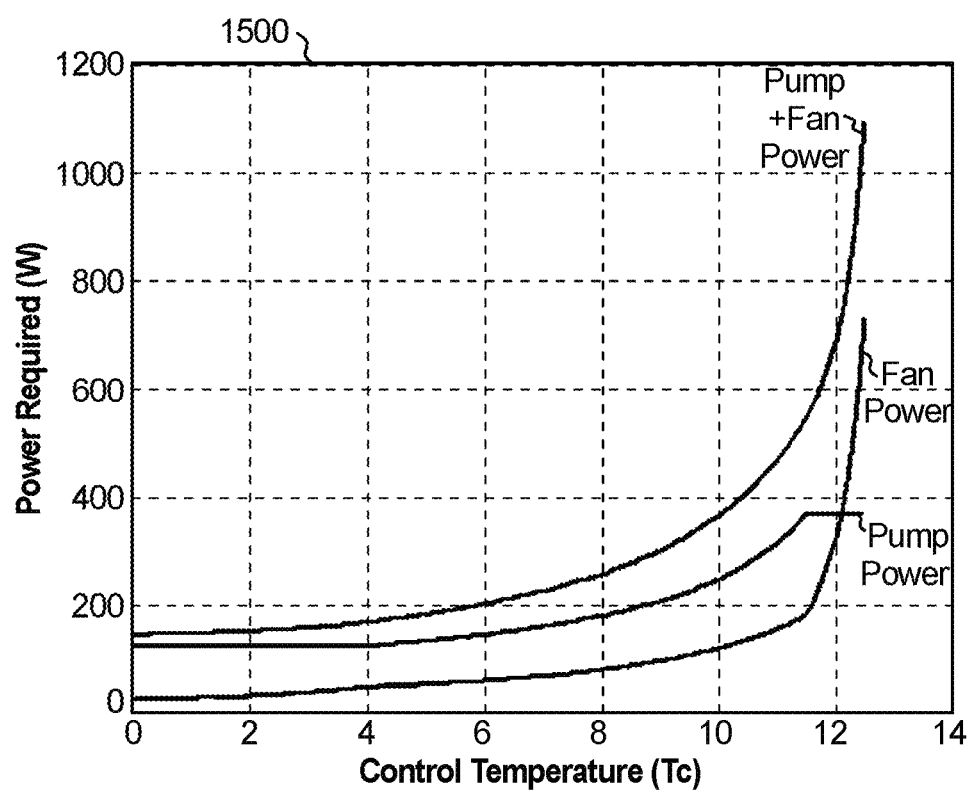
FIG. 15 is a graph of a total cooling power curve when a control temperature Tc is divided among the pump and the fan according to an embodiment of the present disclosure.

FIG. 15 is a graph 1500 showing the total cooling power curve when the third exemplary implementation of an uncoupled set of equations is applied to the same set of equations that were used in the first exemplary implementation.

In a fourth exemplary implementation, $$Tp = x*Tc \quad \ldots \quad \text{(Example, } Tp=0.1*Tc\text{)}$$

$$Tf = (1-x)*Tc \quad \ldots \quad \text{(Example, } Tf=0.9*Tc\text{)}$$

where, x can be a continuous or piecewise step function of Tc and physically possible values of x∈[0,1] (that is, x belonging to the range 0 to 1, including 0 and 1). Since, Pp is a function of Tp and Tp is a function of Tc, Pp can be represented as a function of Tc. Similarly, Pf can be represented as a function of Tc. Thus, a total cooling power, Pt (=Pp+Pf), can be represented as a function of Tc. The minimum cooling energy solution at any given Tc could be obtained by solving the following equation:

$$dPt/dTc @ \text{ any given } Tc=0.$$

This equation can give the value of x at a given Tc for which Pt is maximum or minimum. However, the obtained solution could be non-physical. So in order to find the local minima, the family of Pt(Tc) curves should be plotted for the entire range of x (that is, 0 to 1) and the optimal value of x should be graphically located for different ranges of Tc.

Figure 16A:
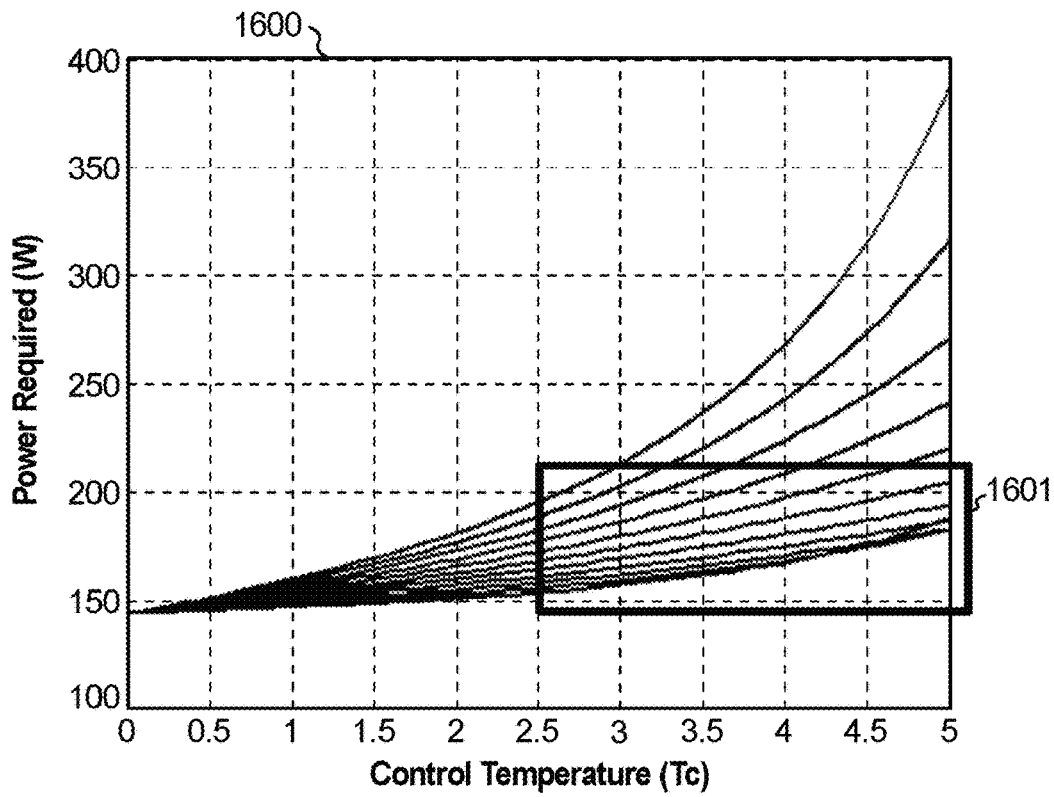
FIGS. 16A-B shows graph of total power curves, according to an embodiment of the present disclosure.
Figure 16B:
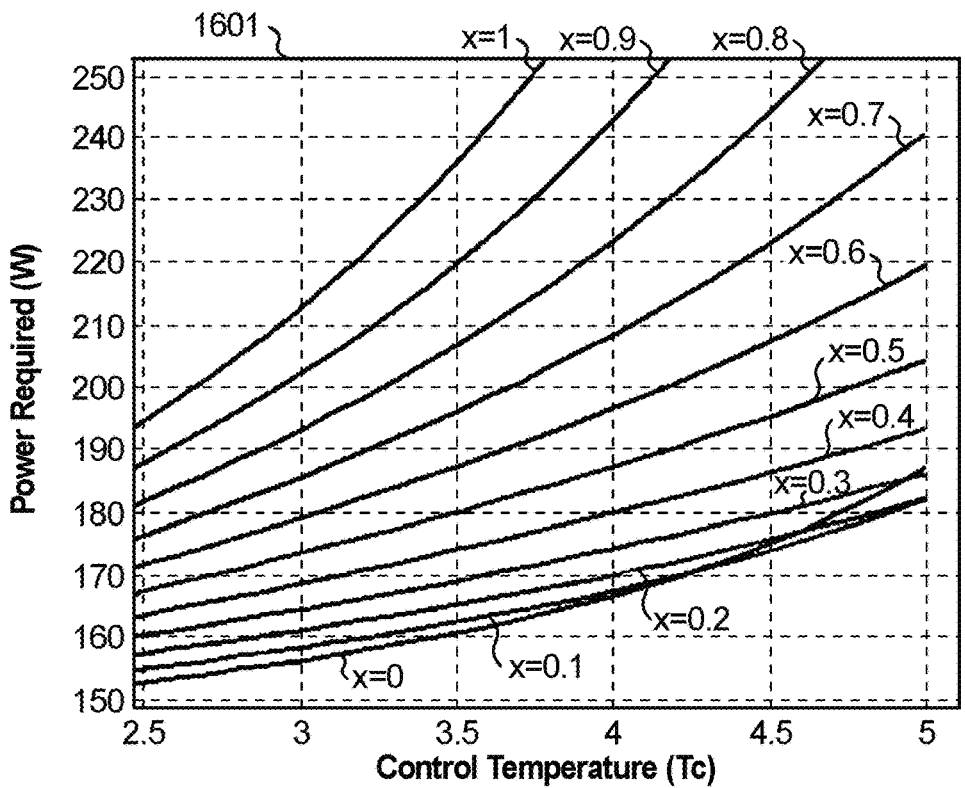
Figure 17:
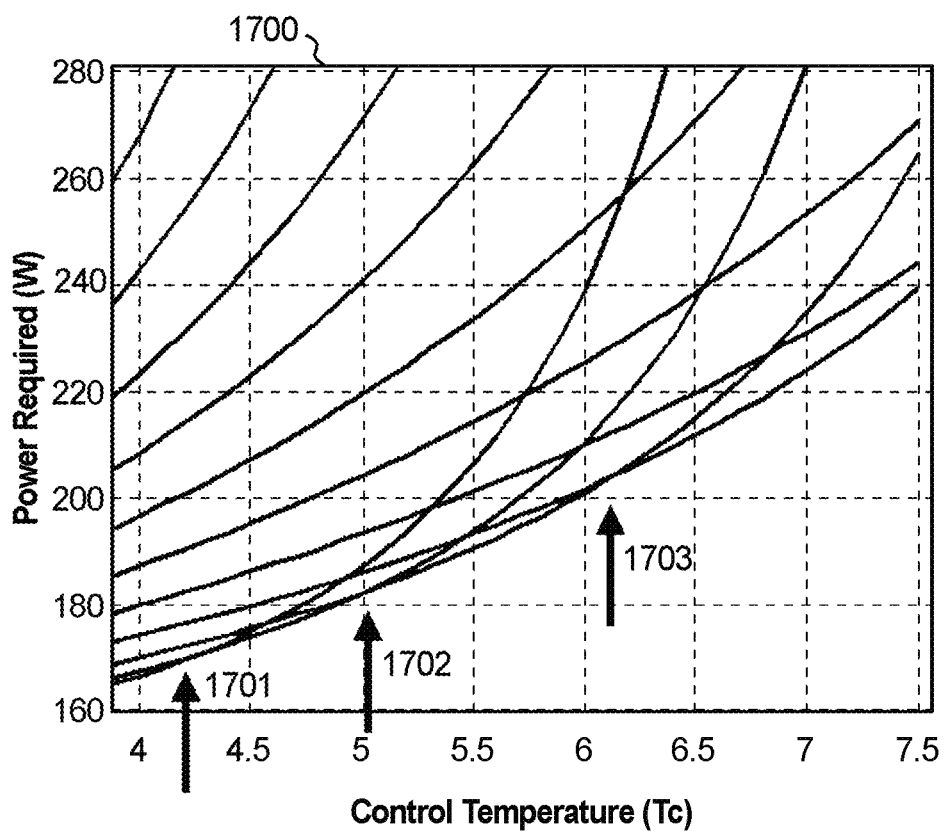
FIG. 17 shows graph of total power curves, according to an embodiment of the present disclosure.

FIG. 16A is a graph 1600 showing a family of total power curves, Pt(Tc) for the entire range of x. FIG. 16B is a graph showing a portion 1601 of the total power curves from FIG. 16A. Similarly, FIG. 17 is another graph 1700 showing a family of total power curves, Pt(Tc). It can be graphically seen that the lowest energy solution for a given Tc shows a piecewise dependence on x. Further, FIG. 17 shows areas 1701-1703 where power curves cross and a lowest energy solution is defined by multiple power curves.

For Tc=0 to ~4.25 C, x=0 is a solution—that is the temperature delta should be provided by the fan. For Tc=4.25 to ~5 C, x=0.1 is a solution—that is in this range 90% of the temperature delta should be provided by the fans and 10% by the pump. For Tc=5 to ~6.1 C, x=0.2 is a solution—that is in this range 80% of the temperature delta should be provided by the fans and 20% by the pump. Depending upon the nature of the functions Fp(Tp) and Ff(Tf) any one of these methods can be a lowest energy solution for controlling to a specified temperature. More generally, this control can be extended to N fans and 2N pumps and the relationship functions such as Fp and Ff can either be generated analytically or numerically.

It should be understood that the methodologies of embodiments of the disclosure may be particularly well-suited for controlling a cooling system, for example, to control a facility at a specific temperature.

By way of recapitulation, according to an exemplary embodiment of the present disclosure, a method for controlling a cooling system based on a heat dissipation of an electronic module and an ambient air temperature includes determining a combination of individual controls on a plurality of components of the cooling system to achieve a specific amount of cooling based on a predetermined low cooling power relationship for the plurality of components, the heat dissipation of the electronic module and the ambient air temperature (see for example, 607-608, FIG. 6A and FIG. 5), and applying the individual controls to the plurality of components (see for example, 609-617, FIG. 6A).

According to an exemplary embodiment of the present disclosure, a method for controlling a cooling system includes determining a relationship between a delta temperature and a power usage for each of a plurality of cooling components of the cooling system (see for example, FIG. 5), determining a low power setting from a combination of the relationships for the plurality of cooling components to maintain a temperature of interest at or below a target temperature (see for example, 608, FIG. 6A), and generating a control signal to the plurality of cooling components according to the low power setting (see for example, 609-617, FIG. 6A).

According to an exemplary embodiment of the present disclosure, a control system cooling at least one electronic module (see for example, 101, FIG. 1) includes a pump (see for example, 107, FIG. 1) for pumping a coolant, a fan (see for example, 106, FIG. 1) disposed at a heat rejection unit (see for example, 103, FIG. 1), and a controller (see for example, 105, FIG. 1) controlling the pump and the fan individually based on a cooling power relationship (see for example, FIG. 5), a heat dissipation of the electronic module and an ambient air temperature, wherein the cooling power relationship is a combination of a first relationship between a delta temperature and a power usage determined for the pump and a second relationship between a delta temperature and a power usage determined for the fan.

The methodologies of embodiments of the disclosure may be particularly well-suited for use in an electronic device or alternative system. Accordingly, embodiments of the present disclosure may take the form of an entirely hardware embodiment or an embodiment combining software and hardware aspects that may all generally be referred to herein as a "processor", "circuit," "module" or "system." Furthermore, embodiments of the present disclosure may take the form of a computer program product embodied in one or more computer readable medium(s) having computer readable program code stored thereon.

Any combination of one or more computer usable or computer readable medium(s) may be utilized. The computer-usable or computer-readable medium may be a computer readable storage medium. A computer readable storage medium may be, for example but not limited to, an electronic, magnetic, optical, electromagnetic, infrared, or semiconductor system, apparatus, device, or any suitable combination of the foregoing. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus or device.

Computer program code for carrying out operations of embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the present disclosure are described above with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions.

These computer program instructions may be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Figure 18:
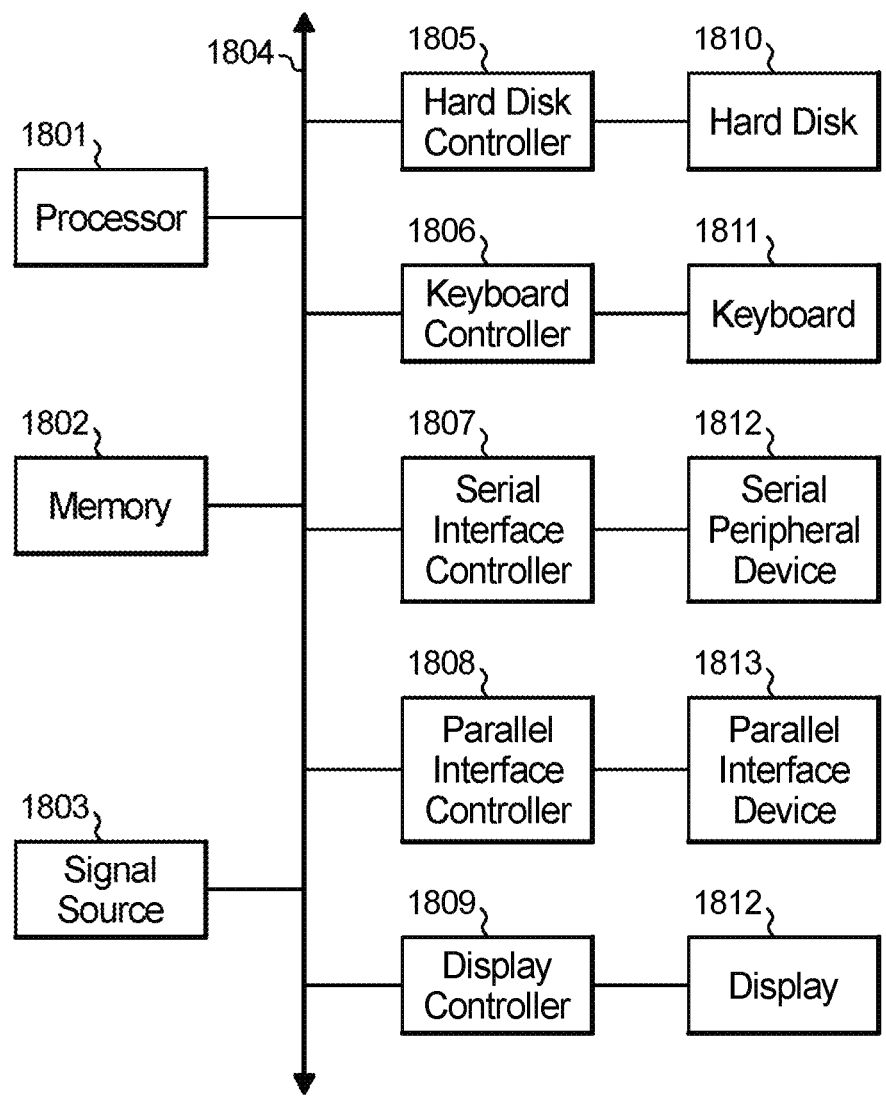
FIG. 18 is a block diagram depicting an exemplary computer system for executing control methods for cooling systems according to an embodiment of the present disclosure.

For example, FIG. 18 is a block diagram depicting an exemplary computer system for controlling a cooling system according to an embodiment of the present disclosure. The computer system shown in FIG. 18 includes a processor 1801, memory 1802, signal source 1803, system bus 1804, Hard Drive (HD) controller 1805, keyboard controller 1806, serial interface controller 1807, parallel interface controller 1808, display controller 1809, hard disk 1810, keyboard 1811, serial peripheral device 1812, parallel peripheral device 1813, and display 1814.

In these components, the processor 1801, memory 1802, signal source 1803, HD controller 1805, keyboard controller 1806, serial interface controller 1807, parallel interface controller 1808, display controller 1809 are connected to the system bus 1804. The hard disk 1810 is connected to the HD controller 1805. The keyboard 1811 is connected to the keyboard controller 1806. The serial peripheral device 1812 is connected to the serial interface controller 1807. The parallel peripheral device 1813 is connected to the parallel interface controller 1808. The display 1814 is connected to the display controller 1809.

In different applications, some of the components shown in FIG. 18 can be omitted. The whole system shown in FIG. 18 is controlled by computer readable instructions, which are generally stored in the hard disk 1810, EPROM or other non-volatile storage such as software. The software can be downloaded from a network (not shown in the figures), stored in the hard disk 1810. Alternatively, software downloaded from a network can be loaded into the memory 1802 and executed by the processor 1801 so as to complete the function determined by the software.

The processor 1801 may be configured to perform one or more methodologies described in the present disclosure, illustrative embodiments of which are shown in the above figures and described herein. Embodiments of the present disclosure can be implemented as a routine that is stored in memory 1802 and executed by the processor 1801 to process the signal from the signal source 1803. As such, the computer system is a general-purpose computer system that becomes a specific purpose computer system when executing the routine of the present disclosure.

Although the computer system described in FIG. 18 can support methods according to the present disclosure, this system is only one example of a computer system. Those skilled of the art should understand that other computer system designs can be used to implement the present invention.

It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to a multi-core processor that contains multiple processing cores in a processor or more than one processing device, and that various elements associated with a processing device may be shared by other processing devices.

The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although illustrative embodiments of the present disclosure have been described herein with reference to the accompanying drawings, it is to be understood that the disclosure is not limited to those precise embodiments, and that various other changes and modifications may be made therein by one skilled in the art without departing from the scope of the appended claims.

What is claimed is:

1. A method for controlling a cooling system based on a heat dissipation of an electronic module and an ambient air temperature, said method comprising:
   selecting a combination of a plurality of individual controls on a plurality of components of said cooling system, wherein the combination of the individual controls is selected to achieve a specific amount of cooling for a given value of total power required by the components based on a predetermined cooling power relationship for said plurality of components, said heat dissipation of said electronic module and said ambient air temperature; and
   applying a first control of said individual controls to a pump of said plurality of components, the first control controlling a speed of said pump; and
   applying a second control of said individual controls to a fan of said plurality of components, the second control controlling a speed of said fan,
   wherein the predetermined cooling power relationship is defined by multiple power curves, each power curve being predetermined for a combination of power required by said pump and said fan for a respective amount of cooling.

2. The method of claim 1, further comprising:
   detecting a high coolant temperature target of a coolant in said cooling system; and
   engaging said method controlling said individual components upon detecting the high coolant temperature target.

3. The method of claim 1, further comprising:
   determining an intermediate coolant temperature target of a coolant in said cooling system, wherein upon determining the determining the intermediate coolant temperature target:
   disengaging said method controlling said individual components; and
   engaging said cooling system at a low setting.

4. The method of claim 3, further comprising:
   determining a low coolant temperature target of a coolant in said cooling system; and
   controlling, upon determining the low coolant temperature target, said control system to maintain a coolant temperature of said cooling system above said low coolant temperature target.

5. The method of claim 4, wherein said low coolant temperature target is greater than or equal to a dew point.

6. A control system cooling at least one electronic module, said control system comprising:
   a pump for pumping a coolant;
   a fan disposed at a heat rejection unit; and
   a controller configured to generate a first control signal to said pump controlling a speed of said pump and a second control signal to said fan controlling a speed of the fan based on a cooling power relationship, a heat dissipation of said electronic module and an ambient air temperature, wherein said cooling power relationship gives a lowest energy solution for a combination of a first relationship between a delta temperature and a power usage determined for said pump and a second relationship between a delta temperature and a power usage determined for said fan, and wherein the lowest energy solution is defined by multiple power curves, each power curve being predetermined for a combination of power required by the pump and the fan for different values of the delta temperature.

7. The control system of claim 6, further comprising a recirculating valve, controlled by the controller, for controlling said coolant to bypass said heat rejection unit.

8. The control system of claim 6, further comprising:
a dew point sensor configured to output a dew point temperature to the controller;
at least one sensor configured to sense an ambient temperature and humidity.

9. The control system of claim 8, wherein the controller is configured to maintain a temperature of the coolant above the dew point temperature and to maintain a temperature of the at least one electronic module below a predefined maximum temperature.

\* \* \* \* \*